(12) United States Patent
Matsubara

(10) Patent No.: US 12,707,991 B2
(45) Date of Patent: Aug. 11, 2026

(54) SEMICONDUCTOR DEVICE PROVIDED WITH ELECTROCONDUCTIVE SUPPORT CONTAINING NON-MAGNETIC MATERIAL FOR MOUNTING SEMICONDUCTOR ELEMENTS

(71) Applicant: ROHM CO., LTD., Kyoto (JP)

(72) Inventor: Hiroaki Matsubara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 368 days.

(21) Appl. No.: 18/363,418

(22) Filed: Aug. 1, 2023

(65) Prior Publication Data

US 2023/0378035 A1 Nov. 23, 2023

Related U.S. Application Data

(63) Continuation of application No. PCT/JP2022/001749, filed on Jan. 19, 2022.

(30) Foreign Application Priority Data

Feb. 2, 2021 (JP) ................................ 2021-014914

(51) Int. Cl.
*H10W 70/40* (2026.01)
*H10W 74/10* (2026.01)
*H10W 90/00* (2026.01)

(52) U.S. Cl.
CPC ....... *H10W 70/457* (2026.01); *H10W 70/424* (2026.01); *H10W 74/111* (2026.01); *H10W 90/811* (2026.01); *H10W 90/736* (2026.01)

(58) Field of Classification Search
CPC ........... H01L 23/49582; H01L 23/3107; H01L 23/49548; H01L 23/49575; H01L 24/32;
(Continued)

(56) References Cited

U.S. PATENT DOCUMENTS 6,518,653 B1 * 2/2003 Takagi .............. H01L 23/49582 257/677
6,710,430 B2 * 3/2004 Minamio .......... H01L 23/49548 257/676
(Continued)

FOREIGN PATENT DOCUMENTS

JP 63-223141 9/1988
JP 2006-032709 2/2006
(Continued)

OTHER PUBLICATIONS

Office Action issued in corresponding German Patent Application No. 11 2022 000 491.6, Sep. 2, 2025, 13 pages w/translation.
(Continued)

*Primary Examiner* — Caleb E Henry
(74) *Attorney, Agent, or Firm* — HSML P.C.

(57) ABSTRACT

A semiconductor device includes: an electroconductive support including leads; a first semiconductor element supported by the support; a second semiconductor element supported by the support; a third semiconductor element supported by the support, electrically connected to the first and the second semiconductor elements, and insulating the first and the second semiconductor elements from each other; and a sealing resin covering the first, the second and the third semiconductor elements and a part of the support. The support includes: a first part overlapping with the first semiconductor element as viewed in a thickness direction of the leads; a second part overlapping with the second semiconductor element as viewed in the thickness direction; and a third part overlapping with the third semiconductor element as viewed in the thickness direction. The third part is made of a non-magnetic material having a relative permeability of less than 100.

18 Claims, 20 Drawing Sheets

(58) Field of Classification Search
CPC ..... H01L 2224/32245; H01L 23/49541; H01L 23/49503; H01L 25/072; H01L 25/16; H01L 23/49562; H01L 2224/48137; H01L 2224/48247; H01L 2224/48257; H01L 2224/49171; H01L 2224/73265; H01L 2924/181; H01L 23/50; H01L 25/18; H10K 59/8723; H10K 59/8722; H10K 71/00; H10K 59/871; H10K 50/8426; H10K 50/841; H10K 50/84; H10W 70/457; H10W 70/424; H10W 74/111; H10W 90/811; H10W 90/736; H10W 72/5449; H10W 72/884; H10W 74/00; H10W 90/753; H10W 90/756; H10W 72/00; H10W 70/481; H10W 70/421; H10W 90/00; H10W 70/411
See application file for complete search history.

(56) References Cited

U.S. PATENT DOCUMENTS 7,952,177 B2 * 5/2011 Kawasaki ............... H01L 24/32 257/692
9,252,088 B2 * 2/2016 Takada .............. H01L 23/49503
9,570,478 B2 * 2/2017 Kim .................. G02F 1/133345
9,851,606 B2 * 12/2017 Cha ....................... G02F 1/1339
9,971,205 B2 * 5/2018 Huang ................ G02F 1/13394
10,197,842 B2 * 2/2019 Kobayashi .......... G02F 1/13439
2005/0218489 A1 * 10/2005 Satou .................... H01L 25/165 257/E23.079
2010/0259201 A1 * 10/2010 Kawano ............ H01L 23/49575 257/140
2011/0090445 A1 * 4/2011 Kim ...................... G02F 1/1339 349/139
2012/0001342 A1 * 1/2012 Sato .................. H01L 23/49582 257/773
2012/0038033 A1 * 2/2012 Oga .................... H01L 23/3107 257/659
2013/0049137 A1 * 2/2013 Uno ....................... H10D 84/83 257/E27.06
2014/0084436 A1 * 3/2014 Funatsu .............. H01L 23/4924 257/676
2014/0320789 A1 * 10/2014 Son ................... G02F 1/133345 156/60
2015/0206830 A1 * 7/2015 Takada .................. H01L 21/561 257/676
2016/0086875 A1 * 3/2016 Kaneda ................... H01L 24/83 438/123
2016/0307854 A1 10/2016 Matsubara et al.
2017/0034916 A1 * 2/2017 Yamagami ........ H01L 23/49811
2018/0182692 A1 * 6/2018 Danno .................. H01L 23/562
2018/0356697 A1 * 12/2018 Ni .......................... H10D 86/60
2019/0157196 A1 5/2019 Sonehara et al.
2020/0144379 A1 * 5/2020 Haga ...................... H10D 64/20
2020/0365497 A1 * 11/2020 Saito ................... H10W 70/481
2022/0139813 A1 * 5/2022 Kawashima ........ H10W 70/468 257/555
2023/0253299 A1 * 8/2023 Kuo .................... H01L 23/3107 257/666

FOREIGN PATENT DOCUMENTS

JP 2009-232637 10/2009
JP 2014-163702 9/2014
JP 2016-207714 12/2016
JP 2018-207127 12/2018
JP 2019-012755 1/2019
WO 2019/203139 10/2019

OTHER PUBLICATIONS

International Search Report and Written Opinion issued in International Application No. PCT/JP2022/001749, Apr. 19, 2022, 5 pages.
Office Action issued in corresponding German Patent application No. 11 2022 000 491.6, Feb. 4, 2026, and machine translation (6 pages).
Decision of Refusal issued in corresponding Japanese Patent Application No. 2022-579428, Feb. 17, 2026, 5 pages w/translation.
Office Action issued in corresponding Japanese Patent Application No. 2002-579428 Dec. 9, 2025, 10 pages w/translation.

* cited by examiner

SEMICONDUCTOR DEVICE PROVIDED WITH ELECTROCONDUCTIVE SUPPORT CONTAINING NON-MAGNETIC MATERIAL FOR MOUNTING SEMICONDUCTOR ELEMENTS

TECHNICAL FIELD

The present disclosure relates to semiconductor devices.

BACKGROUND ART

Conventionally, inverter devices have been incorporated in electric vehicles (including hybrid vehicles) and consumer electronics. Inverter devices are built with semiconductor devices. For example, an inverter device may include a semiconductor device and a power semiconductor, such as an insulated gate bipolar transistor (IGBT) or a metal-oxide-semiconductor field-effect transistor (MOSFET). The semiconductor device includes a control element and a drive element. A control signal outputted from an engine control unit (ECU) to the inverter device is inputted to the control element of the semiconductor device. The control element converts the control signal into a pulse width modulation (PWM) control signal and transmits the resulting signal to the drive element. The drive element timely switches e.g., six power semiconductors on and off based on the PWM control signal. With the six power semiconductors switched on and off with the appropriate timing, the DC power fed from a vehicle-mounted battery is converted into three-phase AC power for driving the motor. JP-A-2018-207127 discloses a semiconductor device that includes a control element (controller chip), a drive element (driver chip) and a transformer chip.

DETAILED DESCRIPTION OF EMBODIMENTS

Figure 1:
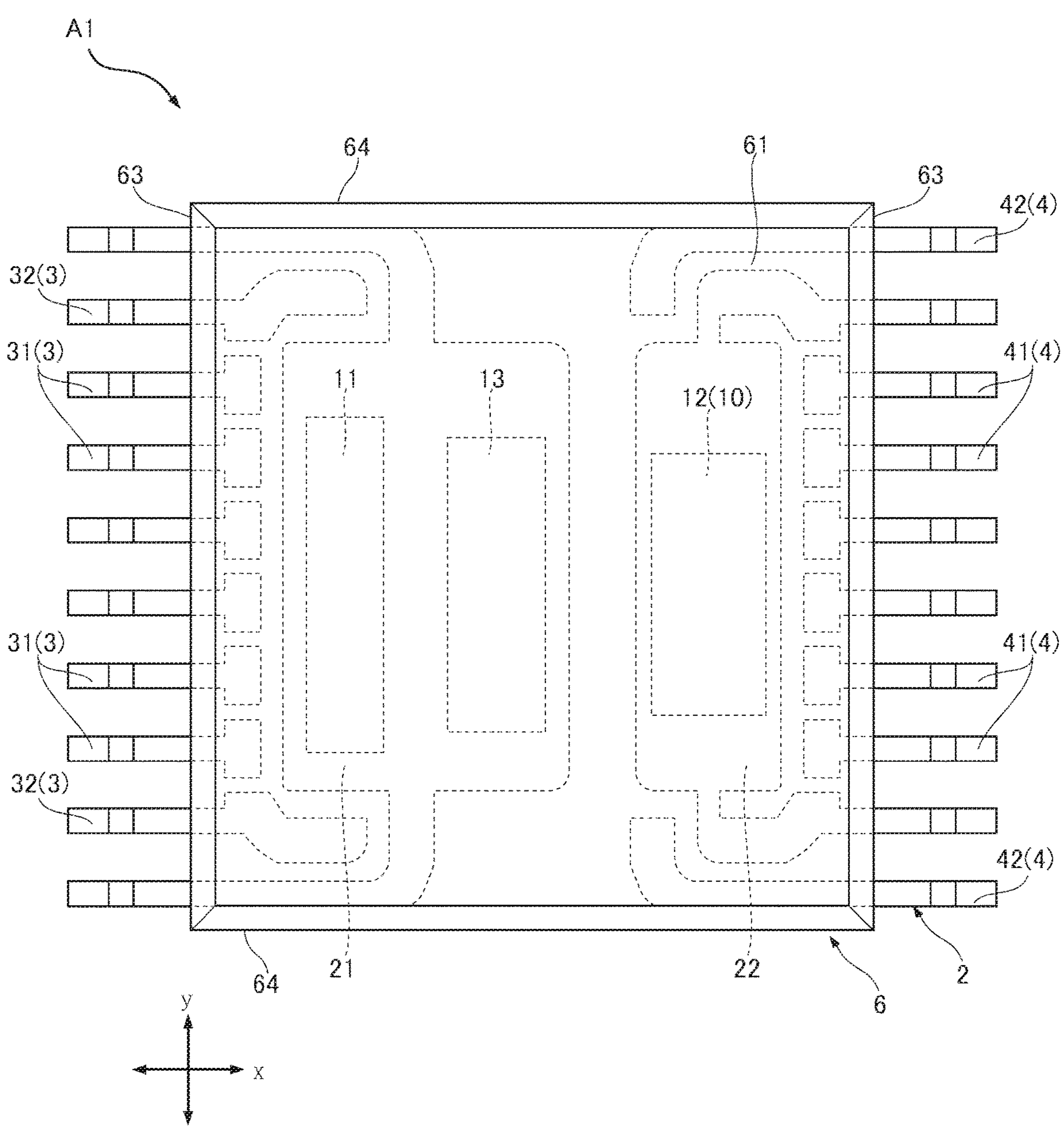
FIG. 1 is a plan view of a semiconductor device according to a first embodiment of the present disclosure.

Embodiments of the present disclosure will be described below with reference to the accompanying drawings.

In the present disclosure, such terms as "first", "second" and "third" are used merely as labels for identifying the items referred to by the terms and not intended to limit the order of these items.

With reference to FIGS. 1 to 8, the following describes a semiconductor device A1 according to a first embodiment of the present disclosure. The semiconductor device A1 includes a first semiconductor element 11, a second semiconductor element 12, a third semiconductor element 13, an electroconductive support 2, a plurality of second wires 52, a plurality of first wires 51, a plurality of third wires 53, a plurality of fourth wires 54 and a sealing resin 6. The semiconductor device A1 is for surface mounting on the wiring board of an inverter device incorporated in an electric vehicle, for example. The semiconductor device A1 is provided in an small outline package (SOP). Note that the packaging of the semiconductor device A1 is not limited to SOP.

Figure 2:
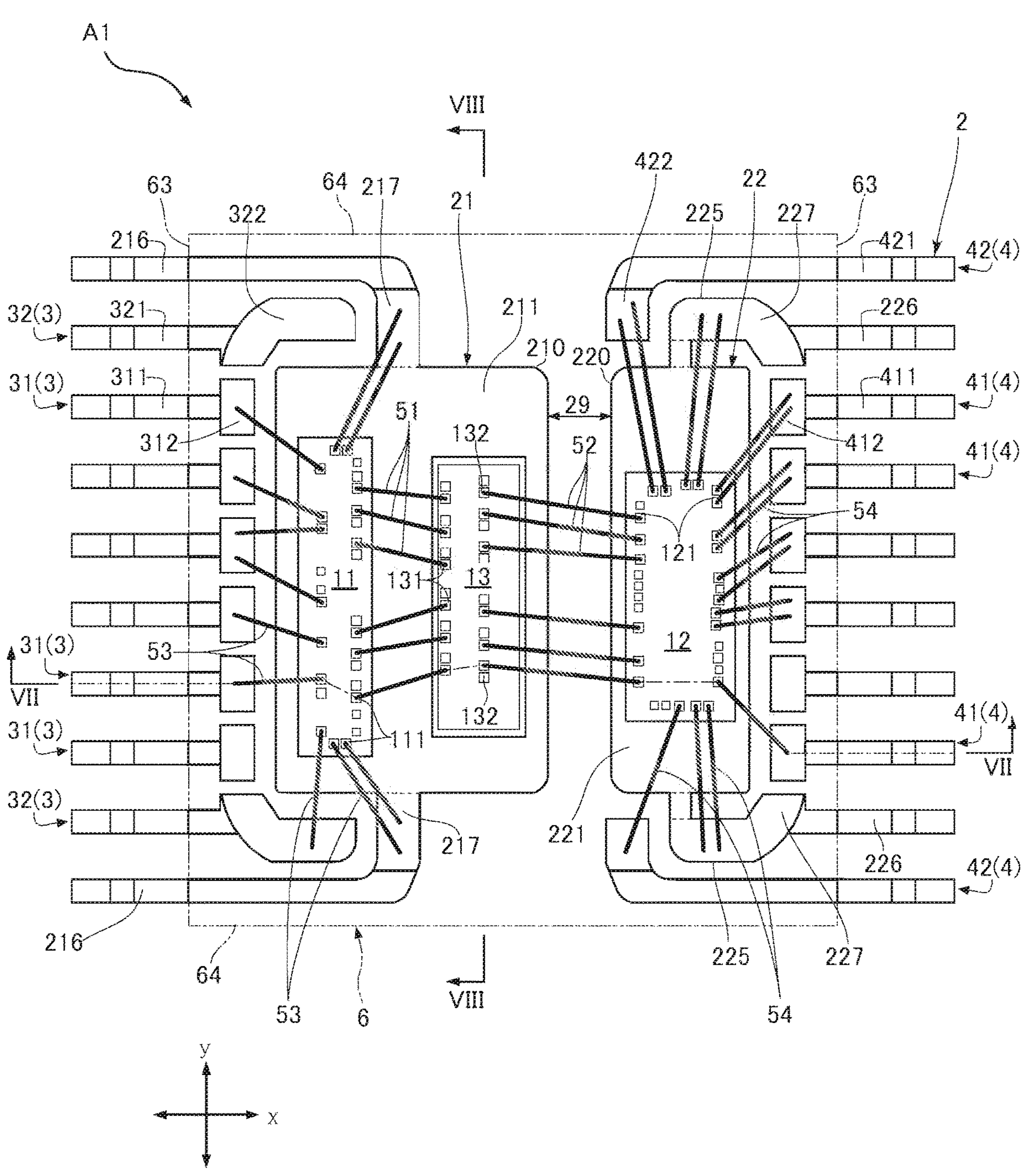
FIG. 2 is a plan view of the semiconductor device according to the first embodiment of the present disclosure.
Figure 3:
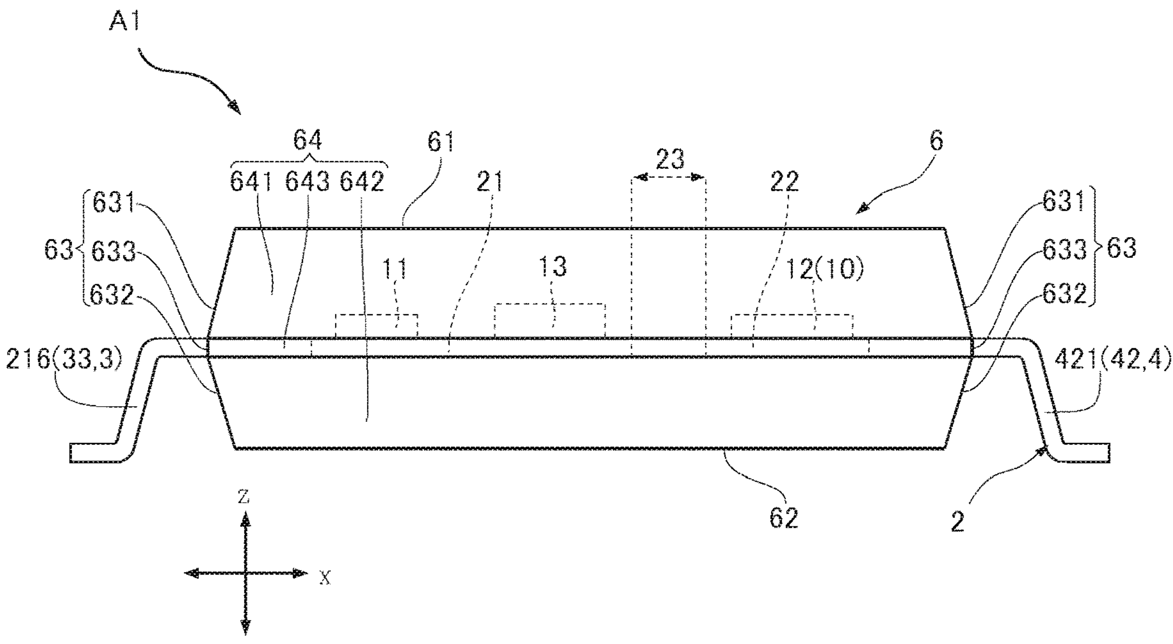
FIG. 3 is a front view of the semiconductor device according to the first embodiment of the present disclosure.
Figure 4:
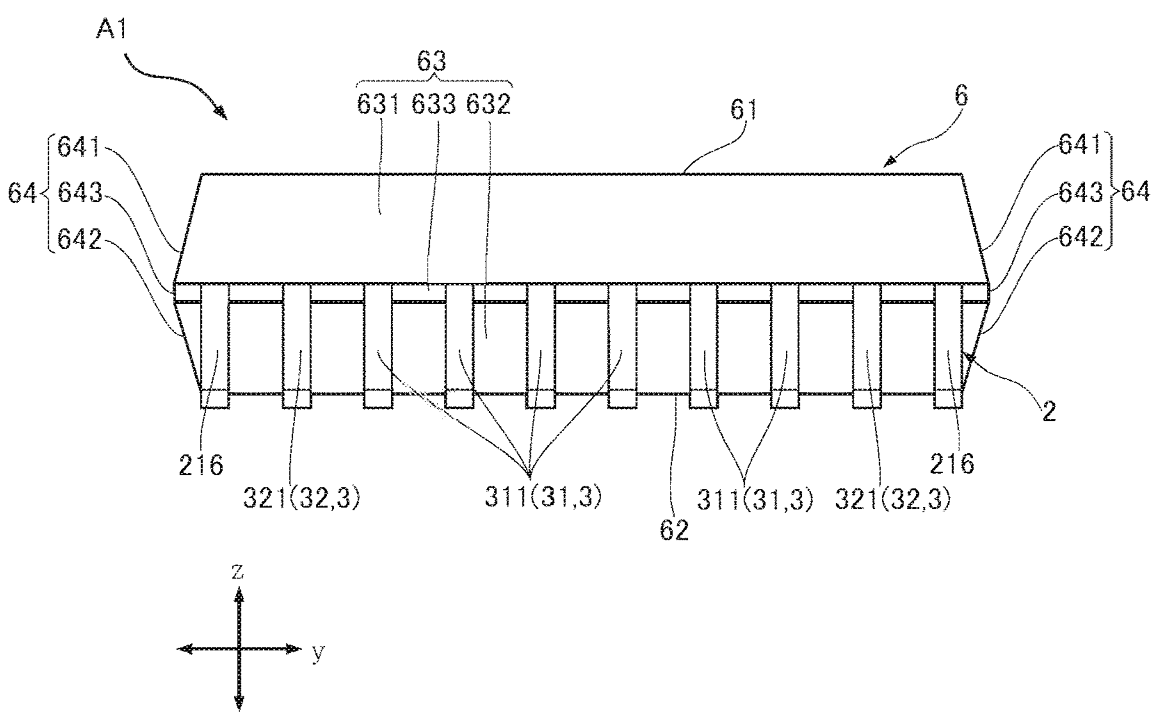
FIG. 4 is a left-side view of the semiconductor device according to the first embodiment of the present disclosure.
Figure 5:
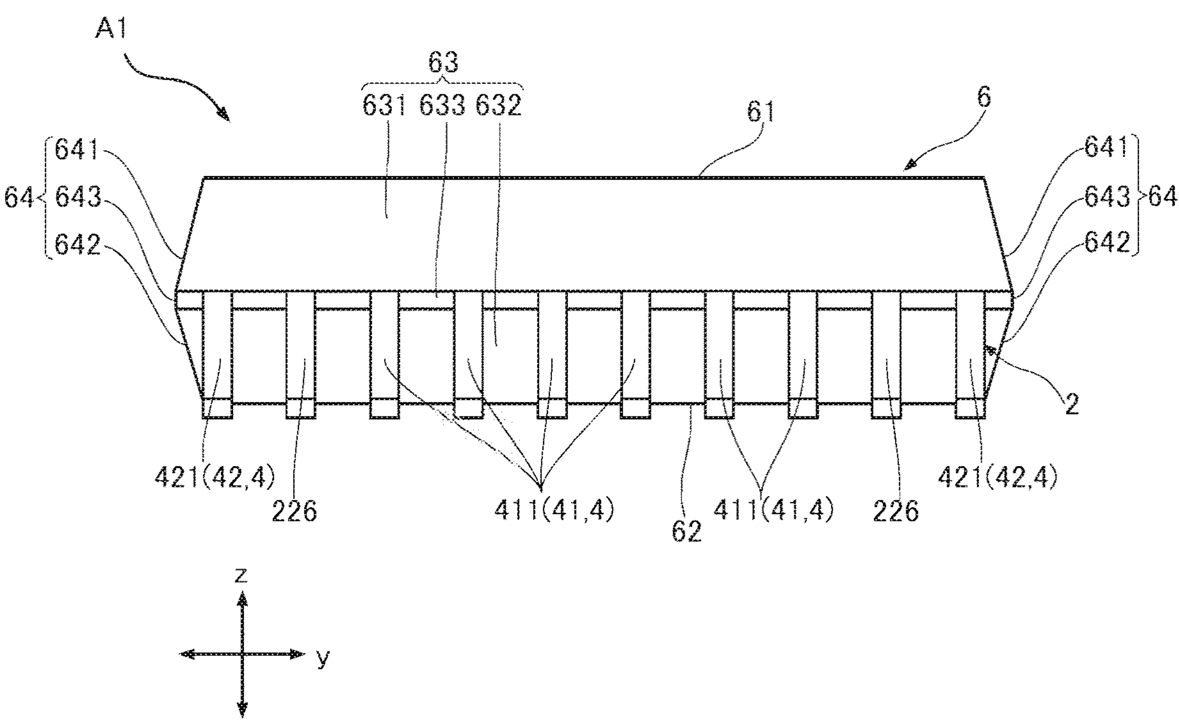
FIG. 5 is a right-side view of the semiconductor device according to the first embodiment of the present disclosure.
Figure 6:
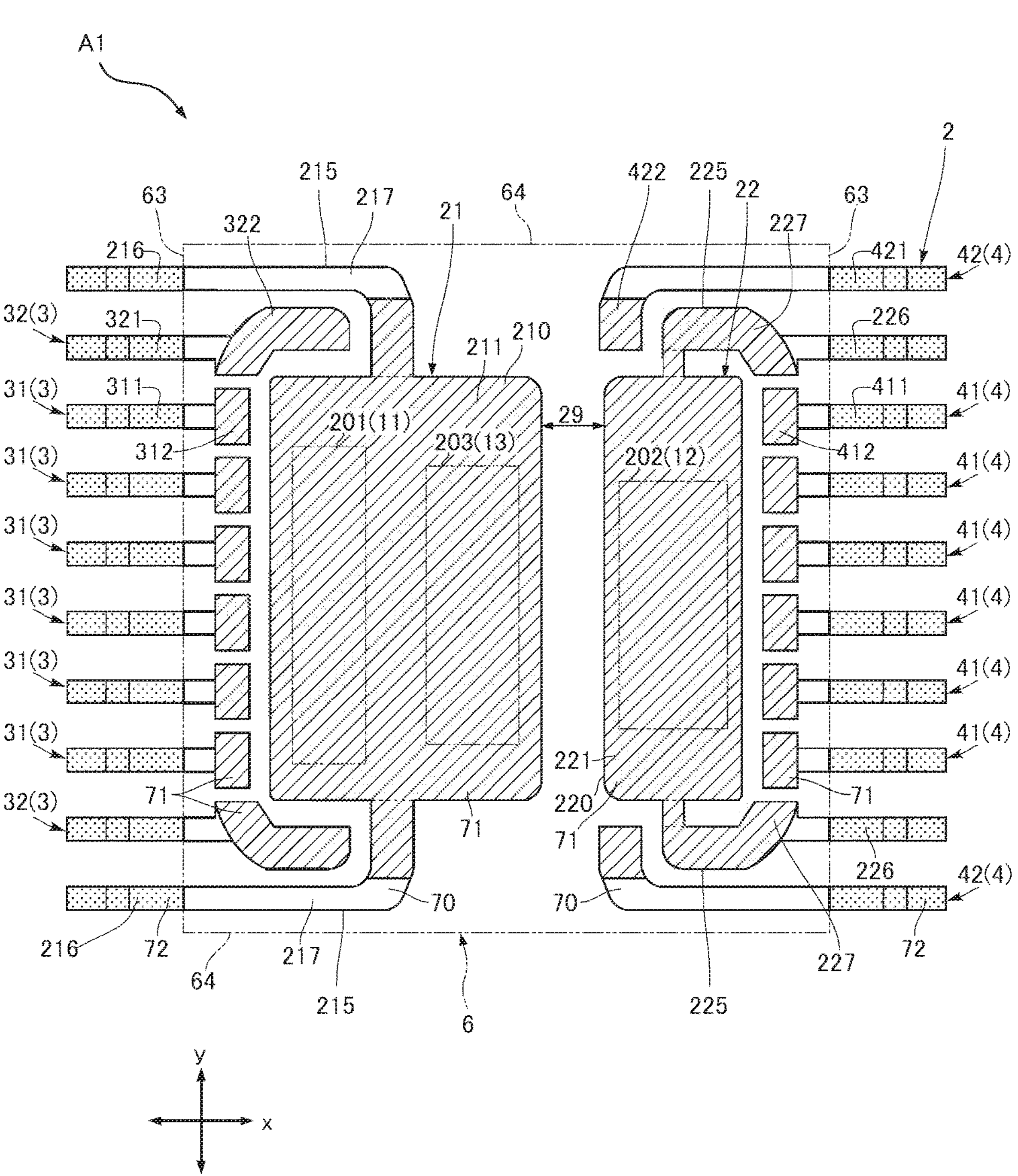
FIG. 6 is a fragmentary plan view of the semiconductor device according to the first embodiment of the present disclosure.
Figure 7:
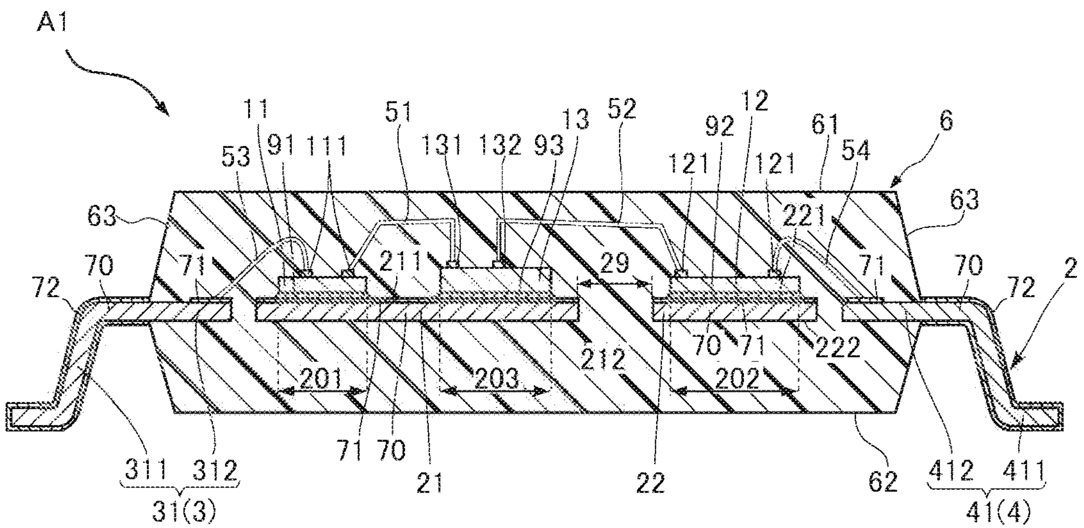
FIG. 7 is a sectional view taken along line VII-VII of FIG. 2.
Figure 7:
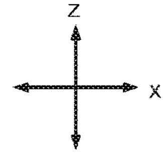
Figure 8:
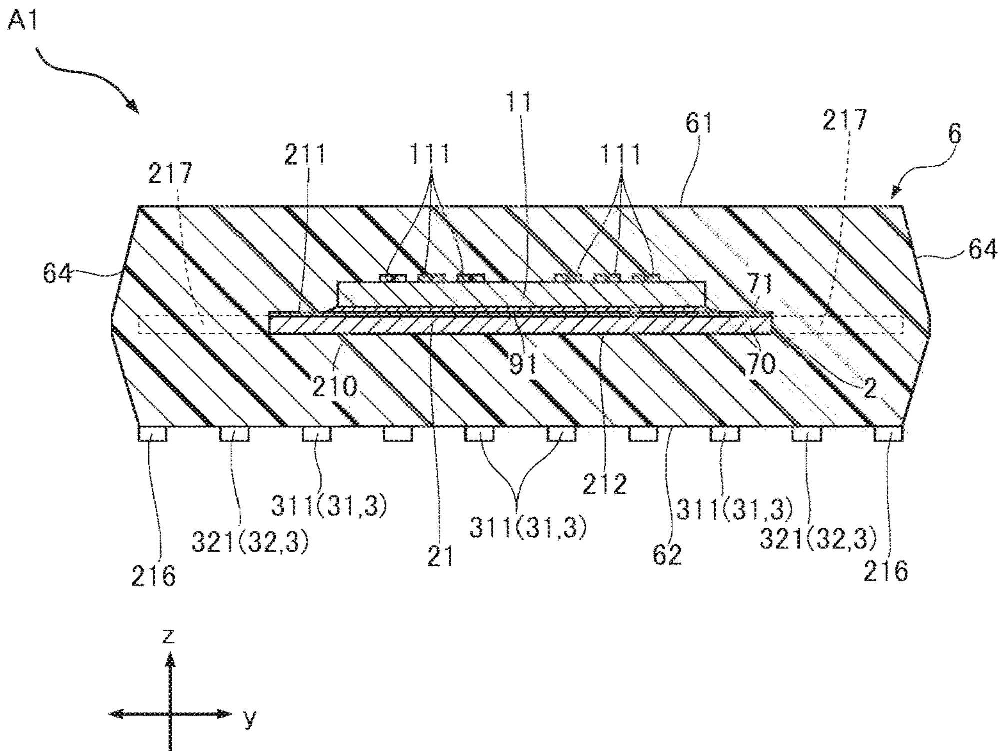
FIG. 8 is a sectional view taken along line VIII-VIII of FIG. 2.
Figure 9:
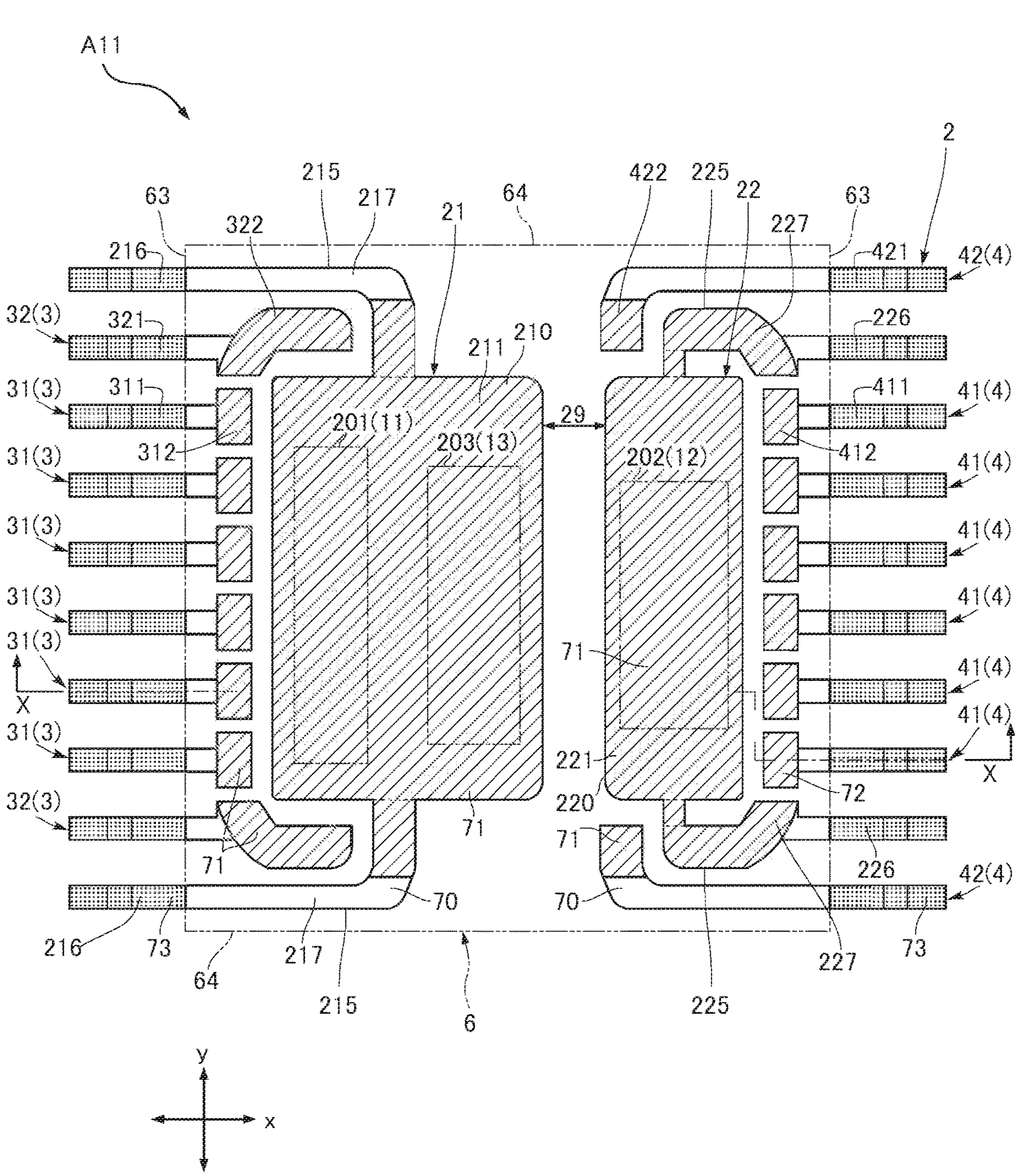
FIG. 9 is a fragmentary plan view of a semiconductor device according to a first variation of the first embodiment of the present disclosure.

FIGS. 1 and 2 are plan views of the semiconductor device A1. FIG. 3 is a front view of the semiconductor device A1. FIG. 4 is a left-side view of the semiconductor device A1. FIG. 5 is a right-side view of the semiconductor device A1. FIG. 6 is a fragmentary plan view of the semiconductor device A1. FIG. 7 is a sectional view taken along line VII-VII of FIG. 2. FIG. 8 is a sectional view taken along line VIII-VIII of FIG. 2. For the convenience of description, FIG. 2 shows the sealing resin 6 with imaginary lines (dash-double dot lines). Similarly, FIG. 9 shows the sealing resin 6 with imaginary lines, and omits the first semiconductor element 11, the second semiconductor element 12, the third semiconductor element 13, the second wires 52, the first wires 51 and the third wires 53.

In the description of the semiconductor device A1, the thickness direction of a first die pad 210 of a first lead 21 and a second die pad 220 of a second lead 22 described later is defined as a "z direction". A direction orthogonal to the z direction is defined as an "x direction". The direction orthogonal to the z direction and the x direction is defined as a "y direction".

The first semiconductor element 11, the second semiconductor element 12 and the third semiconductor element 13 are elements integral to the functionality of the semiconductor device A1. As shown in FIG. 2, the first semiconductor element 11, the second semiconductor elements 12 and the third semiconductor element 13 of the semiconductor device A1 are discrete elements. As viewed in the z direction, the first semiconductor element 11, the second semiconductor element 12 and the third semiconductor element 13 have a rectangular shape that is longer in the y direction.

The first semiconductor element 11 includes a circuit for converting a control signal inputted, for example, from an ECU into a PWM control signal, a transmitting circuit for transmitting a PWM control signal to the second semiconductor element 12, and a receiving circuit for receiving an electrical signal from the second semiconductor element 12.

The second semiconductor element 12 includes a receiving circuit for receiving a PWM control signal, a circuit for switching a switching element (such as an IGBT or a MOSFET) according to a PWM control signal (gate driver), and a transmitting circuit for transmitting an electrical signal to the first semiconductor element 11. Examples of the electrical signal include an output signal of a temperature sensor disposed near the motor.

The third semiconductor element 13 is electrically connected to the first semiconductor element 11 and the second semiconductor element 12, while also insulating the first semiconductor element 11 and the second semiconductor element 12 from each other. During operation of the semiconductor device A1, the third semiconductor element 13 relays a PWM control signal and other electrical signals between the first semiconductor element 11 and the second semiconductor element 12. The third semiconductor element 13 of the semiconductor device A1 is of an inductive type. An insulation transformer is one example of the inductive-type third semiconductor element 13. An insulation transformer implements the transmission of an electrical signal in an insulated condition by inductively coupling two integrated inductors (coils). The third semiconductor element 13 has a substrate made of Si, for example. The inductors made of Cu are disposed on the substrate. The inductors include a transmitting-side inductor and a receiving-side inductor and stacked in the z direction. A dielectric layer made of a suitable material such as $SiO_2$ is interposed between the transmitting-side inductor and the receiving-side inductor. The dielectric layer electrically insulates the transmitting-side inductor and the receiving-side inductor.

In the semiconductor device A1, the second semiconductor element 12 requires a power supply voltage higher than the power supply voltage required by the first semiconductor element 11. This results in a significant potential difference between the first semiconductor element 11 and the second semiconductor element 12. In light of this, the semiconductor device A1 is configured such that the third semiconductor element 13 insulates a first circuit including the first semiconductor element 11 and a second circuit including the second semiconductor element 12. In the semiconductor device A1, the first circuit is held at a lower voltage, and the second circuit is held at a higher voltage. The third semiconductor element 13 relays the transmission of signals between the first circuit and the second circuit. For an inverter device incorporated in an electric vehicle or a hybrid vehicle, the voltage applied to the first semiconductor element 11 is about 5 V or so, whereas the voltage applied to the second semiconductor element 12 can temporarily reach 600 V or higher.

Figure 10:
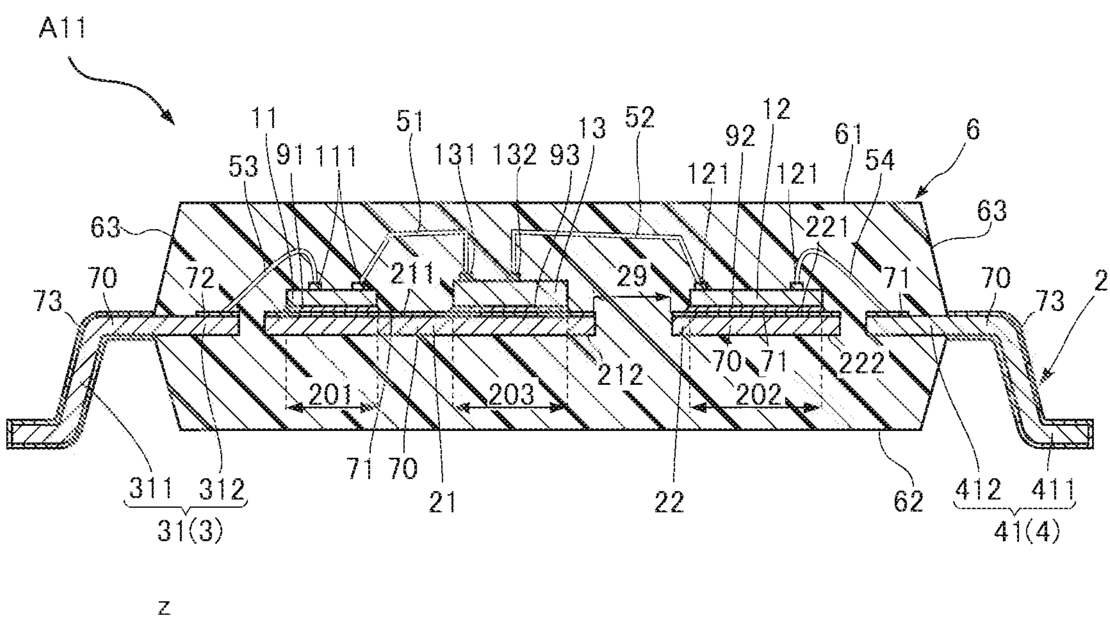
FIG. 10 is a sectional view taken along line X-X of FIG. 9.

As shown in FIGS. 2 and 10, the third semiconductor element 13 is located between the first semiconductor element 11 and the second semiconductor element 12 in the x direction. The first semiconductor element 11 and the third semiconductor element 13 are mounted on the first die pad 210 of the first lead 21 described later. The second semiconductor element 12 is mounted on the second die pad 220 of the second lead 22 described later. In this case, the transmitting-side inductor is preferably located between the first die pad 210 and the receiving-side inductor in the z direction.

As shown in FIGS. 2 and 7, a plurality of electrodes 111 are disposed on the upper surface of the first semiconductor element 11 (the surface facing the same side as a first obverse surface 211 of the first die pad 210 described later). The electrodes 111 are electrically connected to the circuits formed in the first semiconductor element 11. Similarly, a plurality of electrodes 121 are disposed on the upper surface of the second semiconductor element 12 (the surface facing the same side as the first obverse surface 211). The electrodes 121 are electrically connected to the circuits formed in the second semiconductor element 12. A plurality of first electrodes 131 and a plurality of second electrodes 132 are disposed on the upper surface of the third semiconductor element 13 (the surface facing the same side as the first obverse surface 211). Each of the first electrodes 131 and of the second electrodes 132 is electrically connected to either the transmitting-side inductor or the receiving-side inductor. As shown in FIG. 2, the first electrodes 131 are aligned in the y direction on the third semiconductor element 13. Similarly, the second electrodes 132 are aligned in the y direction. In the present embodiment, the electrodes 111 and 121, the first electrodes 131, and the second electrode 132 are made of a non-magnetic material having a relative permeability of less than 100, and examples of such a material include Al, AlCu, AlSiCu and AlSi.

The electroconductive support 2 serves to support the first semiconductor element 11, the second semiconductor element 12, and the third semiconductor element 13 and also serves to form conduction paths to the first semiconductor element 11 and the second semiconductor element 12. The electroconductive support 2 of the present embodiment includes a first lead 21, a second lead 22, a plurality of terminal leads 3, and a plurality of terminal leads 4.

As shown in FIGS. 2 and 3, the first lead 21 includes a first die pad 210 and a pair of terminal parts 215. The first die pad 210 is not limited to a specific shape or size. In the present embodiment, the first die pad 210 is rectangular (or substantially rectangular) as viewed in the z direction. As shown in FIGS. 7 and 8, the first die pad 210 includes a first obverse surface 211 and a first reverse surface 212. The first obverse surface 211 and the first reverse surface 212 are spaced apart from each other in the z direction. The first obverse surface 211 and the first reverse surface 212 face away from each other in the z direction. Each of the first obverse surface 211 and the first reverse surface 212 is flat (or substantially flat). In the present embodiment, the first semiconductor element 11 and the third semiconductor element 13 are mounted on the first obverse surface 211 of the first die pad 210. The first semiconductor element 11 is conductively bonded to the first obverse surface 211 via a first bonding layer 91. The first bonding layer 91 is made of a non-magnetic material having a relative permeability of less than 100, and examples of such a material include a Ag paste and solder. The third semiconductor element 13 is conductively bonded to the first obverse surface 211 via a third bonding layer 93. The third bonding layer 93 is made of a non-magnetic material having a relative permeability of less than 100, and examples of such a material include a Ag paste and solder. The third bonding layer 93 may also be made of a non-magnetic insulating material.

As shown in FIGS. 1 to 4, the pair of terminal parts 215 are connected to the opposite ends of the first die pad 210 in the y direction. The first die pad 210 is thus supported by the terminal parts 215. Each terminal part 215 includes an exposed part 216 and a covered part 217.

As shown in FIGS. 2 and 6, the exposed parts 216 are exposed from the sealing resin 6 as viewed in the z direction. In the illustrated example, the exposed parts 216 have a band shape extending in the x direction. The exposed parts 216 have been bent. Each covered part 217 is present between the first die pad 210 and the corresponding exposed part 216 and covered with the sealing resin 6. The covered parts 217 are flat (or substantially flat).

As shown in FIGS. 2 and 6, the first lead 21 is located on a first side in the x direction with respect to the second lead 22, and the second lead 22 is located on a second side in the x direction with respect to the first lead 21. The second lead 22 includes a second die pad 220 and a pair of terminal parts 225. The second die pad 220 is not limited to a specific shape or size. In the present embodiment, the second die pad 220 is rectangular (or substantially rectangular) as viewed in the z direction. As shown in FIGS. 7 and 8, the second die pad 220 includes a second obverse surface 221 and a second reverse surface 222. The second obverse surface 221 and the second reverse surface 222 are spaced apart from each other in the z direction. The second obverse surface 221 and the second reverse surface 222 face away from each other in the z direction. Each of the second obverse surface 221 and the second reverse surface 222 is flat (or substantially flat). In the present embodiment, the second semiconductor element 12 is mounted on the second obverse surface 221 of the second die pad 220. The second semiconductor element 12 is conductively bonded to the second obverse surface 221 via a second bonding layer 92. The second bonding layer 92 is made of a non-magnetic material having a relative permeability of less than 100, and examples of such a material include a Ag paste and solder. With the first semiconductor element 11 conductively bonded to the first lead 21 and the second semiconductor element 12 to the second lead 22, the first lead 21 and the second lead 22 will be held at different potentials during the operation of the semiconductor device A1.

The first die pad 210 and the second die pad 220 are spaced apart from each other by a pad gap 29. The pad gap 29 extends in the y direction as viewed in the z direction. As viewed in the x direction, the first die pad 210 and the second die pad 220 overlap with each other. The first die pad 210 and the second lead 22 are not limited to a specific thickness and may have a thickness between 100 and 300 μm, for example.

As shown in FIGS. 1 to 4, the pair of terminal parts 225 are connected to the opposite ends of the second die pad 220 in the y direction. The second die pad 220 is thus supported by the terminal parts 225. Each terminal part 225 includes an exposed part 226 and a covered part 227.

As shown in FIGS. 2 and 6, the exposed parts 226 are exposed from the sealing resin 6 as viewed in the z direction. In the illustrated example, the exposed parts 226 have a band shape extending in the x direction. The exposed parts 226 have been bent. Each covered part 227 is present between the second die pad 220 and the corresponding exposed part 226 and covered with the sealing resin 6. The covered parts 227 are flat (or substantially flat).

As shown in FIGS. 6 and 7, the part of the electroconductive support 2 that overlaps with the first semiconductor element 11 as viewed in the z direction is defined as a first part 201. The part of the electroconductive support 2 that overlaps with the second semiconductor element 12 as viewed in the z direction is defined as a second part 202. The part of the electroconductive support 2 that overlaps with the third semiconductor element 13 as viewed in the z direction is defined as a third part 203. In the present embodiment, the first part 201 and the third part 203 are included in the first die pad 210 of the first lead 21. The second part 202 is included in the second die pad 220 of the second lead 22.

As shown in FIGS. 1 and 2, each of the terminal leads 3 includes a part located on the first side in the x direction with respect to the first die pad 210 of the first lead 21. The terminal leads 3 are arranged side by side in the y direction. At least one of the terminal leads 3 is electrically connected to the first circuit mentioned above. As shown in FIGS. 1 and 4, the terminal leads 3 are exposed from a side surface of the sealing resin 6, the side surface being the one of a later-described pair of first side surfaces 63 that is located on the first side in the x direction. The plurality of terminal leads 3 include a plurality of terminal leads 31 and a pair of terminal leads 32.

As shown in FIGS. 2 and 4, the terminal leads 31 are located between the exposed parts 216 of the pair of the terminal parts 215 of the first lead 21 in the y direction. Among the plurality of terminal leads 31, each terminal lead that is electrically connected to the first semiconductor element 11 is an example of a "first terminal lead". Each terminal lead 31 includes an exposed part 311 and a covered part 312.

As shown in FIGS. 2 and 6, the exposed parts 311 have a band shape extending in the x direction as viewed in the z direction. The exposed parts 311 protrude from the sealing resin 6 in the x direction as viewed in the z direction. As shown in FIG. 3, the exposed parts 311 have been bent.

As shown in FIG. 2, each covered part 312 is connected to the corresponding exposed part 311 and covered with the sealing resin 6. In the illustrated example, each covered part 312 includes a part connected to the corresponding exposed part 311 and a rectangular part that is wider in the y direction than the connected part. The covered parts 312 are flat (or substantially flat).

As shown in FIGS. 2, 4 and 6, the pair of terminal leads 32 are located to sandwich the terminal leads 31 in the y direction. Each terminal lead 32 includes an exposed part 321 and a covered part 322.

As shown in FIGS. 2 and 6, the exposed parts 321 have a band shape extending in the x direction as viewed in the z direction. The exposed parts 321 protrude from the sealing resin 6 in the x direction as viewed in the z direction. As shown in FIG. 3, the exposed parts 321 have been bent.

As shown in FIG. 2, each covered part 322 is connected to the corresponding exposed part 321 and covered with the sealing resin 6. In the illustrated example, each covered part 322 includes a part connected to the corresponding exposed part 321 and a rectangular part that is wider in the y direction than the connected part. The covered parts 322 are flat (or substantially flat).

As shown in FIGS. 1, 2 and 6, each terminal lead 4 includes a part located on the second side in the x direction with respect to the second die pad 220 of the second lead 22. The terminal leads 4 are arranged side by side in the y direction. At least one of the terminal leads 4 is electrically connected to the second circuit mentioned above. As shown in FIGS. 1, 5 and 6, the terminal leads 4 are exposed from a side surface of the sealing resin 6, the side surface being the one of the later-described pair of first side surfaces 63 that is located on the second side in the x direction. The plurality of terminal leads 4 include a plurality of terminal leads 41 and a pair of terminal leads 42.

As shown in FIGS. 2, 5 and 6, the terminal leads 41 are located between the pair of terminal parts 225 of the second lead 22 in the y direction. Among the plurality of terminal leads 41, each terminal lead 41 that is electrically connected to the second semiconductor element 12 is an example of a "second terminal lead". Each terminal lead 41 includes an exposed part 411 and a covered part 412.

As shown in FIGS. 2 and 6, the exposed parts 411 have a band shape extending in the x direction as viewed in the z direction. The exposed parts 411 protrude from the sealing resin 6 in the x direction as viewed in the z direction. As shown in FIG. 3, the exposed parts 411 have been bent.

As shown in FIGS. 2 and 6, each covered part 412 is connected to the corresponding exposed part 411 and covered with the sealing resin 6. Each covered part 412 includes a part connected to the corresponding exposed part 411 and a rectangular part that is wider in the y direction than the connected part. The covered parts 412 are flat (or substantially flat).

As shown in FIGS. 2, 5 and 6, the pair of terminal leads 42 are located to sandwich the terminal leads 41 and the pair of terminal parts 225 in the y direction. Each terminal lead 42 includes an exposed part 421 and a covered part 422.

As shown in FIG. 2, the exposed parts 421 have a band shape extending in the x direction as viewed in the z direction. The exposed parts 421 protrude from the sealing resin 6 in the x direction as viewed in the z direction. As shown in FIG. 3, the exposed parts 421 have been bent.

As shown in FIG. 2, each covered part 422 is connected to the corresponding exposed part 421 and covered with the sealing resin 6. Each covered part 422 includes a part extending in the x direction to reach the exposed part 421 and a part extending inward in the y direction from the connected part. The covered parts 422 are flat (or substantially flat).

The second wires 52, the first wires 51, the third wires 53 and the fourth wires 54 form conduction paths together with the first lead 21, the second lead 22, and the terminal leads 3 and 4, enabling the first semiconductor element 11, the second semiconductor element 12 and the third semiconductor element 13 to perform their functions. The second wires 52, the first wires 51, the third wires 53 and the fourth wires 54 are made of a non-magnetic material having a relative permeability of less than 100, and examples of such a material include metal containing Au, Cu or Al.

As shown in FIGS. 2 and 7, the first wires 51 are bonded to the third semiconductor element 13 and the first semiconductor element 11. The first wires 51 electrically connect the third semiconductor element 13 and the first semiconductor element 11. In the semiconductor device A1, each first wire 51 is bonded to a first electrode 131 of the third semiconductor element 13 and an electrode 111 of the first semiconductor element 11. The first wires 51 are arranged side by side in the y direction. As viewed in the z direction, the first wires 51 overlap with the first die pad 210.

As shown in FIGS. 2 and 7, the second wires 52 are bonded to the third semiconductor element 13 and the second semiconductor element 12. The second wires 52 electrically connect the third semiconductor element 13 and the second semiconductor element 12. In the semiconductor device A1, each second wire 52 is bonded to a second electrode 132 of the third semiconductor element 13 and an electrode 121 of the second semiconductor element 12. The second wires 52 are arranged side by side in the y direction. Each second wire 52 extends across the pad gap 29.

As shown in FIGS. 2 and 7, each third wire 53 is bonded to an electrode 111 of the first semiconductor element 11 and also to a terminal lead 3 (the covered part 312 of a terminal lead 31 or the covered part 322 of a terminal lead 32) or the covered part 217 of a terminal part 215. The third wires 53 electrically connect the first semiconductor element 11 to at least one of the terminal leads 31 and 32. In the illustrated example, five of the six terminal leads 31 are connected to the electrodes 111 of the first semiconductor element 11 via the third wires 53, and such a terminal lead 31 is an example of a "first terminal lead". In addition, the one of the two terminal leads 32 shown at the bottom in the figure is connected to an electrode 111 of the first semiconductor element 11 via a third wire 53. In an alternative example, all of the terminal leads 31 may be configured as the first terminal leads by being electrically connected to the first semiconductor element 11 via the third wires 53.

As shown in FIGS. 2 and 7, each fourth wire 54 is bonded to an electrode 121 of the second semiconductor element 12 and also to a terminal lead 4 (the covered part 412 of a terminal lead 41 or the covered part 422 of a terminal lead 42) or the covered part 227 of a terminal part 225. The fourth wires 54 electrically connect the second semiconductor element 12 to at least one of the terminal leads 41 and 42. In the illustrated example, five of the six terminal leads 41 are connected to the electrodes 121 of the second semiconductor element 12 via the fourth wires 54, and such a terminal lead 41 is an example of a "second terminal lead". In addition, each of the two terminal leads 42 is connected to an electrode 121 of the second semiconductor element 12 via a fourth wire 54. In an alternative example, all of the terminal leads 41 may be configured as the second terminal leads by being electrically connected to the second semiconductor element 12 via the fourth wires 54.

As shown in FIG. 1, the sealing resin 6 covers the first semiconductor element 11, the second semiconductor element 12, the third semiconductor element 13 and a part of the electroconductive support 2. As shown in FIG. 7, the sealing resin 6 also covers the first wires 51, the second wires 52, the third wires 53 and the fourth wires 54. The sealing resin 6 is made of a non-magnetic material having a relative permeability less than 100, such as a material containing black epoxy resin. The sealing resin 6 is rectangular as viewed in the z direction.

As shown in FIGS. 3 to 5, the sealing resin 6 includes a top surface 61, a bottom surface 62, a pair of first side surfaces 63 and a pair of second side surfaces 64.

As shown in FIGS. 3 to 5, the top surface 61 and the bottom surface 62 are spaced apart from each other in the z direction. The top surface 61 and the bottom surface 62 face away from each other in the z direction. Each of the top surface 61 and the bottom surface 62 is flat (substantially flat).

As shown in FIGS. 3 to 5, the first side surfaces 63 are connected to the top surface 61 and the bottom surface 62 and spaced apart from each other in the x direction. The first side surface 63 that is located on the first side in the x direction is where the terminal leads 3 and the terminal parts 215 are exposed. The first side surface 63 that is located on the second side in the x direction is where the terminal leads 4 and the terminal parts 225 are exposed.

As shown in FIGS. 3 to 5, each first side surface 63 includes a first upper part 631, a first lower part 632 and a first middle part 633. The first upper part 631 is connected to the top surface 61 at one end in the z direction and to the first middle part 633 at the other end in the z direction. The first upper part 631 is inclined relative to the top surface 61. The first lower part 632 is connected to the bottom surface 62 at one end in the z direction and to the first middle part 633 at the other end in the z direction. The first lower part 632 is inclined relative to the bottom surface 62. The first middle part 633 is connected to the first upper part 631 at one end in the z direction and to the first lower part 632 at the other end in the z direction. The first middle part 633 is parallel to both the z direction and the y direction. As viewed in the z direction, the first middle part 633 is located outside the top surface 61 and the bottom surface 62. The parts of the terminal leads 3 and of the terminal parts 215 are exposed from one of the first middle parts 633, and the parts of the terminal leads 4 and of the terminal parts 225 are exposed from the other first middle part 633.

As shown in FIGS. 3 to 5, the second side surfaces 64 are connected to the top surface 61 and the bottom surface 62 and spaced apart from each other in the y direction. As shown in FIGS. 1 and 2, the first lead 21, the second lead 22, and the terminal leads 3 and 4 are spaced apart from either of the second side surfaces 64.

As shown in FIGS. 3 to 5, each second side surface 64 includes a second upper part 641, a second lower part 642 and a second middle part 643. The second upper part 641 is connected to the top surface 61 at one end in the z direction and to the second middle part 643 at the other end in the z direction. The second upper part 641 is inclined relative to the top surface 61. The second lower part 642 is connected to the bottom surface 62 at one end in the z direction and to the second middle part 643 at the other end in the z direction. The second lower part 642 is inclined relative to the bottom surface 62. The second middle part 643 is connected to the second upper part 641 at one end in the z direction and to the second lower part 642 at the other end in the z direction. The second middle part 643 is parallel to both the z direction and the x direction. As viewed in the z direction, the second middle part 643 is located outside the top surface 61 and the bottom surface 62.

Generally, the motor driver circuit of an inverter device is built with a half-bridge circuit that includes a low-side (low-voltage side) switching element and a high-side (high-voltage side) switching element. The following description is directed to an example in which the switching elements are MOSFETs. In such an example, the source of the low-side switching element and the gate driver that drives the low-side switching element both have a reference potential held at ground. In contrast, the source of the high-side switching element and the gate driver that drives the high-side switching element both have a reference potential corresponding to the potential at the output node of the half-bridge circuit. The potential at the output node varies in response to the switching of the high-side switching element and the low-side switching element, so that the reference potential of the gate driver for the high-side switching element varies as well. During the time the high-side switching element is on, the reference potential is equal to the voltage applied to the drain of the switching element (e.g., about 600 V or higher). In the semiconductor device A1, the first semiconductor element 11 and the second semiconductor element 12 are connected to different grounds. Thus, when the semiconductor device A1 is used as a gate driver for driving a high-side switching element, a transient voltage as high as the voltage applied to the drain of the high-side switching element can be applied to the ground of the second semiconductor element 12.

As shown in FIGS. 6 to 8, the electroconductive support 2 of the present embodiment may be made up of a base 70, a metal layer 71 and a metal layer 72. The base 70 is a component that provides the stiffness and electrical conductivity of the electroconductive support 2 and made of a non-magnetic material having a relative permeability of less than 100. Specifically, the material of the base 70 may be Cu or a Cu alloy, for example. One example of a Cu alloy, which is a non-magnetic material, is EFTEC (registered trademark) available from Furukawa Electric Co., Ltd. The base 70 may be formed from a metal plate made of such a material by cutting and bending.

The metal layer 71 is a layer of metal formed on the base 70 by, for example, plating. The metal layer 71 is made of a non-magnetic material having a relative permeability of less than 100. Specifically, the material of the metal layer 71 may be Ag, for example.

The metal layer 72 is a layer of metal formed on the base 70 by, for example, plating. The metal layer 72 is made of a non-magnetic material having a relative permeability of less than 100. Specifically, the material of the metal layer 72 may be Sn, for example.

As shown in FIGS. 6 to 8, the first lead 21 of the semiconductor device A1 includes the first die pad 210 composed of the base 70 and the metal layer 71. The metal layer 71 of the first die pad 210 is formed on the first obverse surface 211. The exposed part 216 of each terminal part 215 is composed of the base 70 and the metal layer 72. The metal layer 72 of each exposed part 216 is formed on all surfaces of the exposed part 216. Each covered part 217 is composed of the base 70 and the metal layer 71. The metal layer 71 of the covered part 217 is formed on a region of the covered part 217 connected to the first obverse surface 211.

The second die pad 220 of the second lead 22 is composed of the base 70 and the metal layer 71. The metal layer 71 of the second die pad 220 is formed on the second obverse surface 221. The exposed part 226 of each terminal part 225 is composed of the base 70 and the metal layer 72. The metal layer 72 of the exposed part 226 is formed on all surfaces of the exposed part 226. Each covered part 227 is composed of the base 70 and the metal layer 71. The metal layer 71 of the covered part 227 is formed on a region of the covered part 227 connected to the second obverse surface 221.

The exposed part 311 of each terminal lead 31 is composed of the base 70 and the metal layer 72. The metal layer 72 of the exposed part 311 is formed on all surfaces of the exposed part 311. The covered part 312 of each terminal lead 31 is composed of the base 70 and the metal layer 71. The metal layer 71 of the covered part 312 is formed on a region of the upper surface of the covered part 312 connected to the first die pad 210.

The exposed part 321 of each terminal lead 32 is composed of the base 70 and the metal layer 72. The metal layer 72 of the exposed part 321 is formed on all surfaces of the exposed part 321. The covered part 322 of each terminal lead 32 is composed of the base 70 and the metal layer 71. The metal layer 71 of the covered part 322 is formed on a region of the top surface of the covered part 322 connected to the first die pad 210.

The exposed part 411 of each terminal lead 41 is composed of the base 70 and the metal layer 72. The metal layer 72 of the exposed part 411 is formed on all surfaces of the exposed part 411. The covered part 412 of each terminal lead 41 is composed of the base 70 and the metal layer 71. The metal layer 71 of the covered part 412 is formed on a region of the top surface of the covered part 412 connected to the second die pad 220.

The exposed part 421 of each terminal lead 42 is composed of the base 70 and the metal layer 72. The metal layer 72 of the exposed part 421 is formed on all surfaces of the exposed part 421. The covered part 422 of each terminal lead 42 is composed of the base 70 and the metal layer 71. The metal layer 71 of the covered part 422 is formed on a region of the top surface of the covered part 422 connected to the second die pad 220.

As described above, each part of the electroconductive support 2 is composed of the base 70 and the metal layer 71 or 72. This means that the electroconductive support 2 of the semiconductor device A1 is entirely made of a non-magnetic material. More specifically, the first lead 21 and the second lead 22 are entirely made of a non-magnetic material, and all of the terminal leads 31, including each first terminal lead, and all of the terminal leads 41, including each second terminal lead, and all of the terminal leads 32 and 42 are entirely made of a non-magnetic material. This configuration is one example in which the first part 201, the second part 202 and the third part 203 are made of a non-magnetic material.

Next, the operation and effect of the semiconductor device A1 will be described.

During operation, the transmitting-side inductor and the receiving-side inductor of the third semiconductor element 13 are inductively coupled. An unwanted disturbance of the magnetic field produced by the inductive coupling may lead to problems, such as reduced transmission efficiency of signals between the transmitting-side inductor and the receiving-side inductor. In the present embodiment, the third part 203 is made of a non-magnetic material. The third part 203 overlaps with the third semiconductor element 13 as viewed in the z direction. This configuration can prevent a disturbance of the magnetic field relating to the third semiconductor element 13, thereby improving the transmission efficiency.

As shown in FIGS. 6 and 7, in the present embodiment, the first die pad 210 (the first lead 21) is entirely made of a non-magnetic material. This configuration can further improve the transmission efficiency. Furthermore, each part of the electroconductive support 2 covered with the sealing resin 6 is made of a non-magnetic material. This configuration is preferable for improving the transmission efficiency. Furthermore, the whole part of the electroconductive support 2 of the present embodiment is made of a non-magnetic material. This configuration is desirable for improving the transmission efficiency.

The first bonding layer 91, the second bonding layer 92 and the third bonding layer 93 are made of a non-magnetic material. This configuration of the first bonding layer 91, the second bonding layer 92 and the third bonding layer 93 are prevented from disturbing the magnetic field around the third semiconductor element 13, thereby improving the transmission efficiency.

The electrodes 111 of the first semiconductor element 11, the electrodes 121 of the second semiconductor element 12, and the first electrodes 131 and the second electrodes 132 of the third semiconductor element 13 are made of a non-magnetic material. This configuration can more reliably prevent a disturbance of the magnetic field around the third semiconductor element 13.

The first wires 51, the second wires 52, the third wires 53 and the fourth wires 54 are each made of a non-magnetic material. The sealing resin 6 is also made of a non-magnetic material. This configuration contributes to improved transmission efficiency.

FIGS. 9 to 22 show other embodiments and variations of the present disclosure. In these figures, the same or similar elements as those of the above embodiment are denoted by the same reference signs.

FIGS. 9 and 10 show a first variation of the semiconductor device A1. A semiconductor device A11 of this variation differs from the semiconductor device A1 in the configuration of the electroconductive support 2.

In this variation, a metal layer 73 is used in place of the metal layer 72 disposed on the parts of the electroconductive support 2 in the semiconductor device A1. The metal layer 73 may be composed of a plurality of plated layers formed by depositing Ni, Pd and Au in this order. The metal layer 73 contains Ni (relative permeability: about 600), which is a magnetic material. That is, the parts of the electroconductive support 2 provided with the metal layer 73 (the exposed parts 311, 321, 411, 421, 216 and 226) are not parts made of a non-magnetic material. In the present disclosure, "a part, etc., made of a non-magnetic material" should refer to a case where all the sections constituting that part are made of a non-magnetic material. Thus, for example, when a part includes a base 70 which is made of a non-magnetic material and a metal layer 73 which is made of a magnetic material, this part is not regarded as being made of a non-magnetic material.

In this variation, the parts of the electroconductive support 2 covered with the sealing resin 6 are made of a non-magnetic material.

This variation can improve the transmission efficiency. The parts of the electroconductive support 2 covered with the sealing resin 6 are made of a non-magnetic material. These covered parts are closer within the electroconductive support 2 to the third semiconductor element 13 than the parts exposed from the sealing resin 6. Thus, improved transmission efficiency can be expected. In addition, permitting the use of a magnetic material, such as Ni, Pd or Au, on a part of the electroconductive support 2 exposed from the sealing resin 6 makes it possible to use the metal layer 73 without compromising the effect of preventing a disturbance of the magnetic field around the third semiconductor element, where the metal layer 73 is compatible with a conductive bonding material, such as solder, and effective for protecting the electroconductive support 2 from deterioration.

Figure 11:
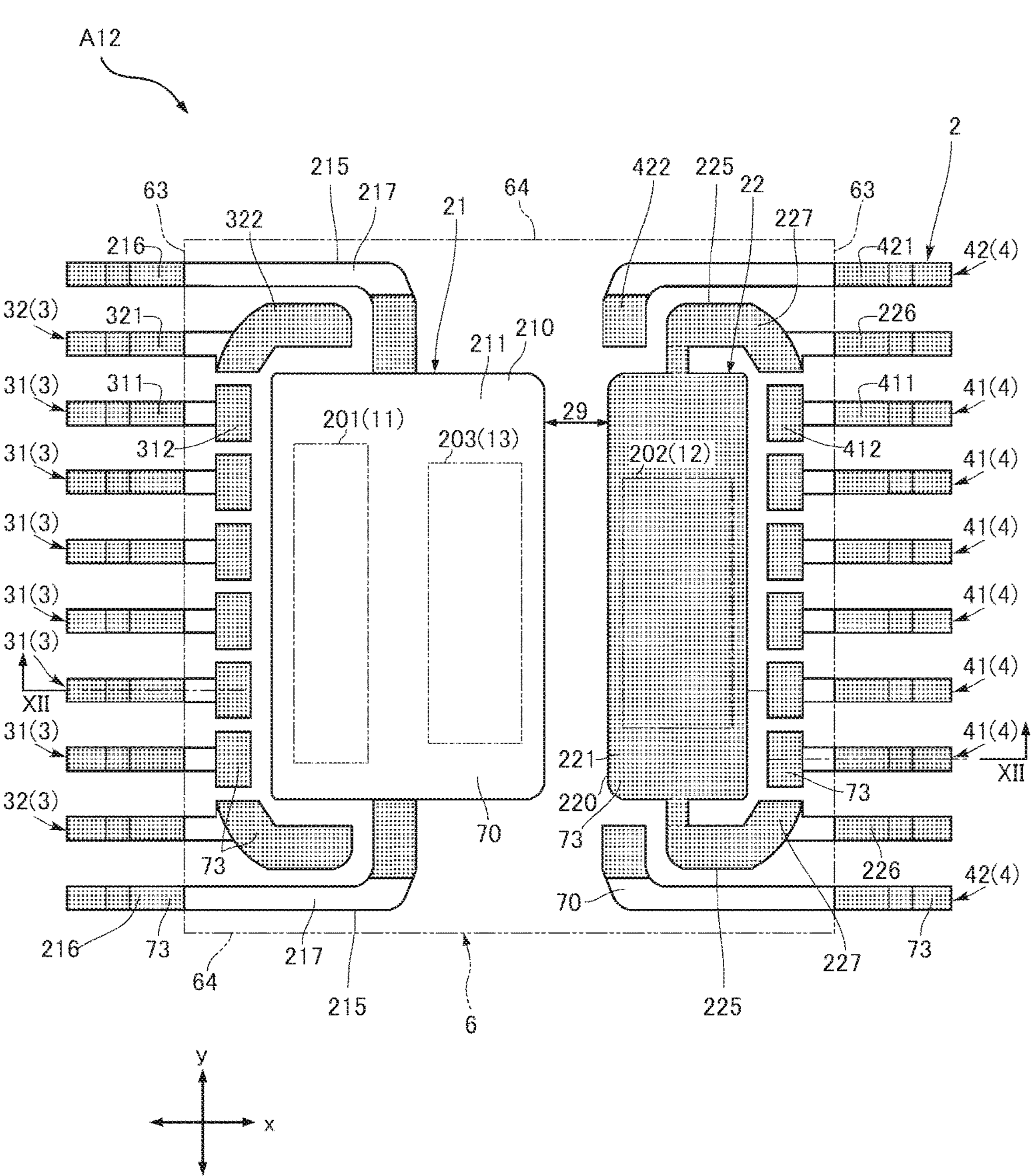
FIG. 11 is a fragmentary plan view of a semiconductor device according to a second variation of the first embodiment of the present disclosure.
Figure 12:
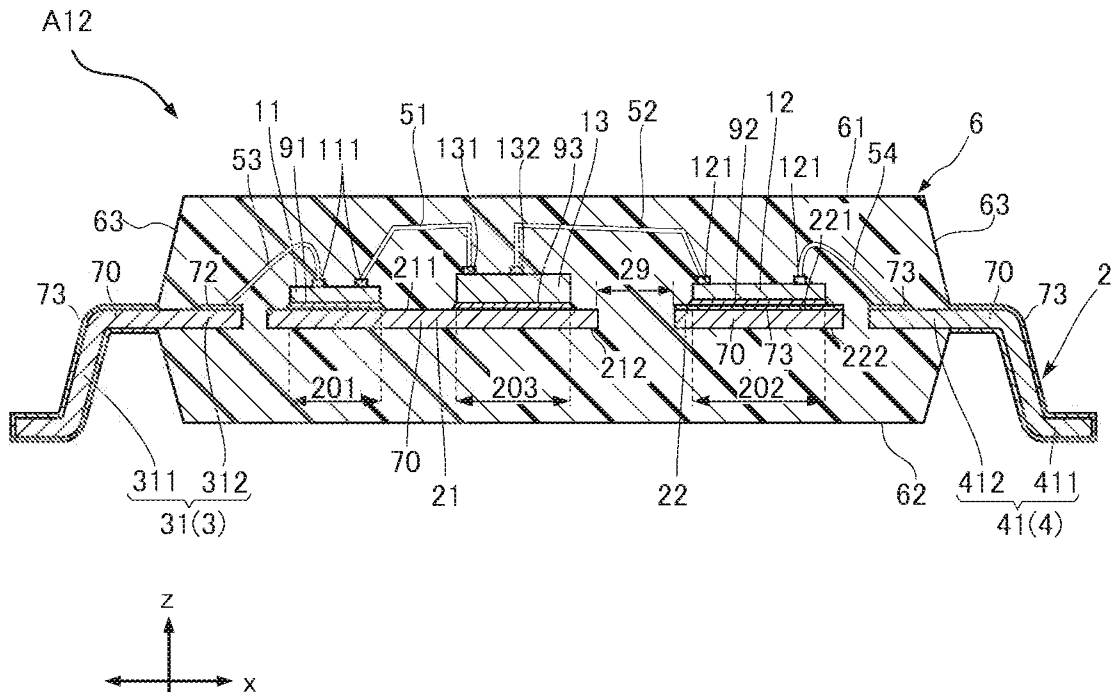
FIG. 12 is a sectional view taken along line XII-XII of FIG. 11.

FIGS. 11 and 12 show a second variation of the semiconductor device A1. A semiconductor device A12 of this variation differs from the semiconductor device A1 in the configuration of the electroconductive support 2.

The electroconductive support 2 of this variation is composed of the base 70 and the metal layer 73. In this variation, in addition to the metal layer 73 disposed in the semiconductor device A11, the metal layer 73 is also used in place of the metal layer 71 disposed on the parts of the second lead 22 and the terminal leads 3 and 4. In this variation, the first die pad 210 of the first lead 21 is composed of the base 70 but not provided with the metal layer 73. Each of the pair of terminal parts 215 is provided with the metal layer 73 covering a region of the covered part 217 connected to the first obverse surface 211.

In this variation, each of the first part 201 and the third part 203 is composed of the base 70 alone and hence is a part made of a non-magnetic material. In contrast, the second part 202 includes a magnetic material and hence is not a part made of a non-magnetic material.

This variation can improve the transmission efficiency. Notably, this variation can improve the transmission efficiency by configuring the third part 203 as a part made of a non-magnetic material, while permitting the use of the metal layer 73, which is made of a magnetic material, for improving the strength of bonding of the electroconductive support 2 with a conductive bonding material and protecting the electroconductive support 2 from deterioration.

Figure 13:
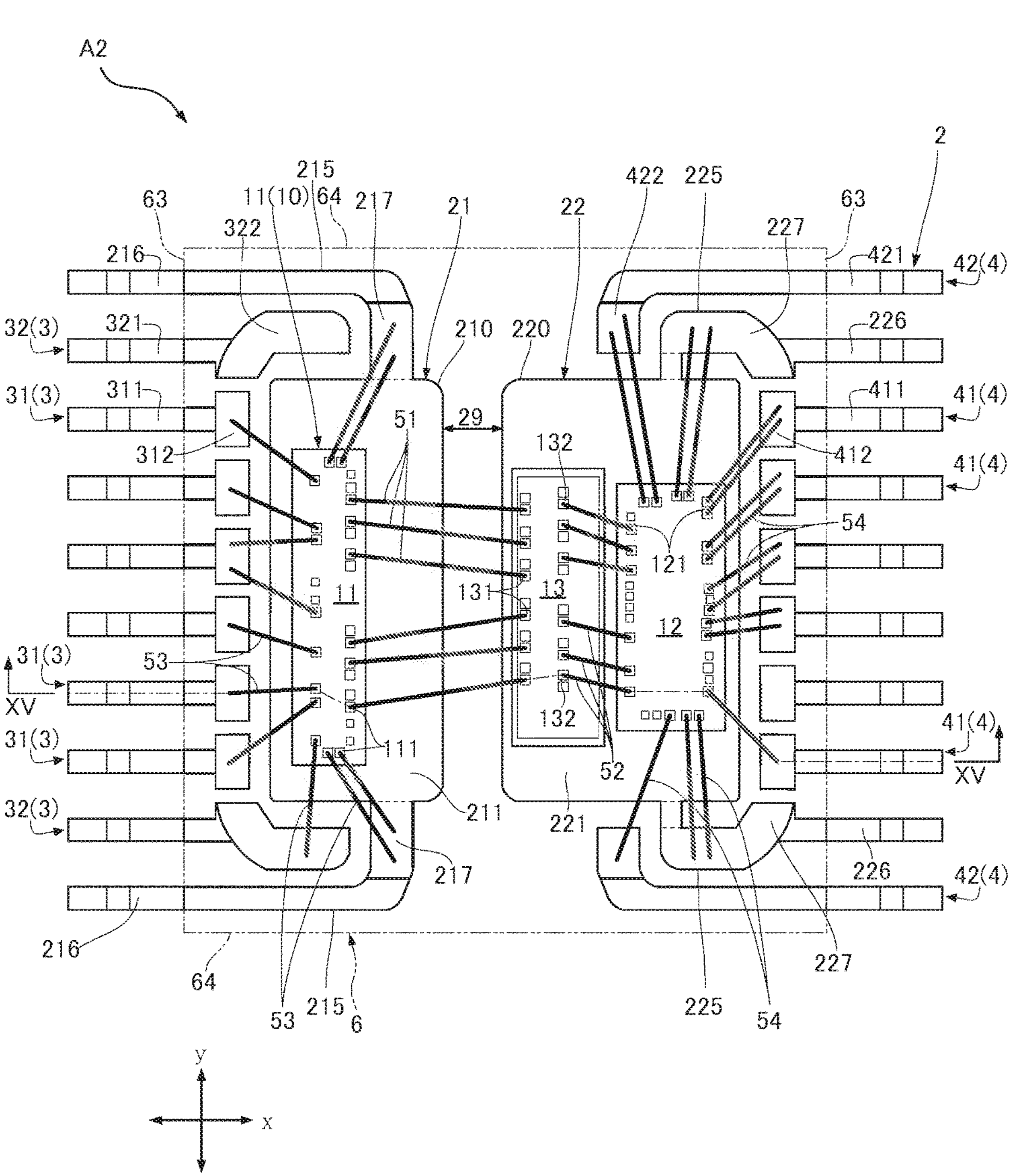
FIG. 13 is a plan view of a semiconductor device according to a second embodiment of the present disclosure.
Figure 14:
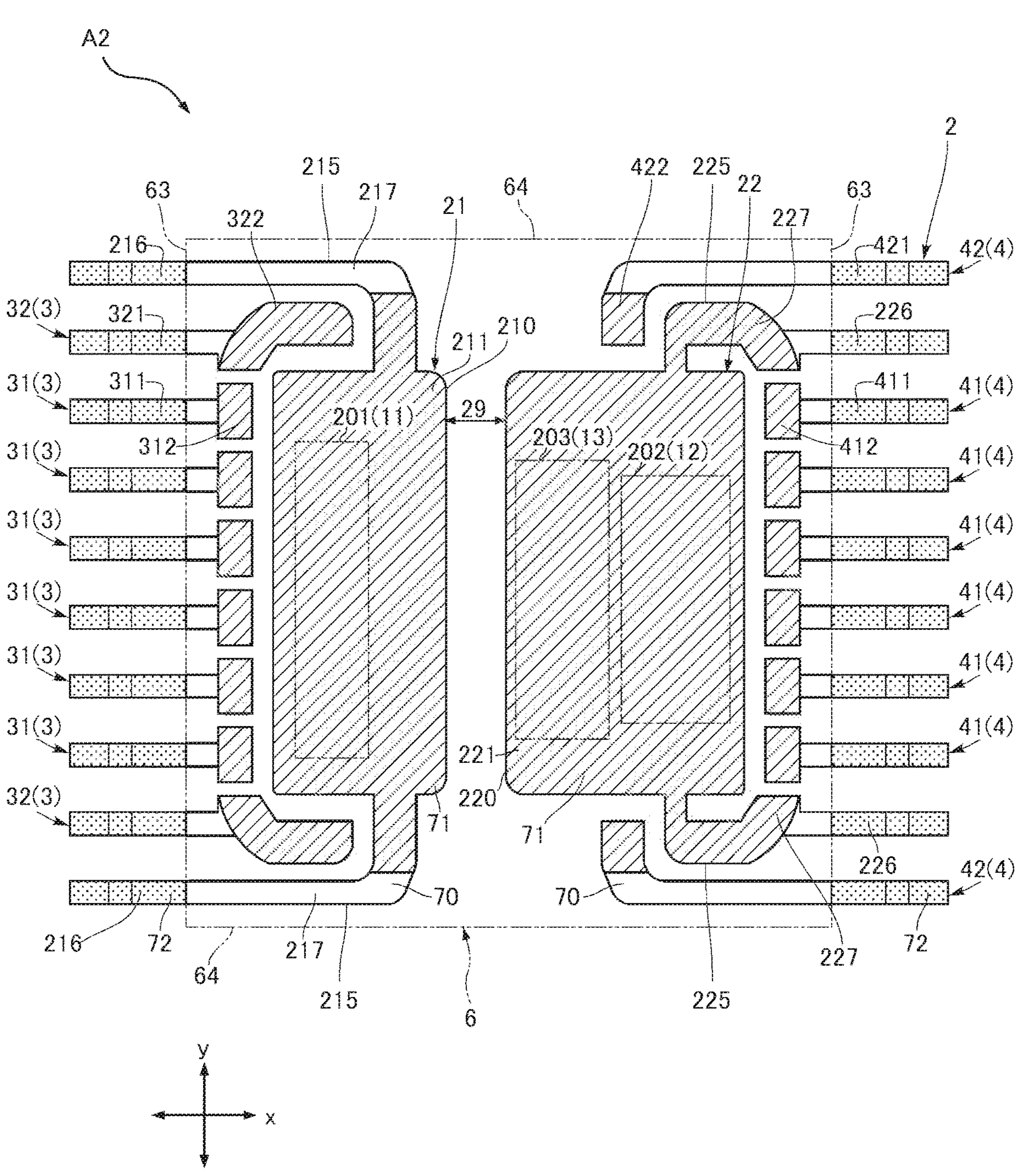
FIG. 14 is a fragmentary plan view of the semiconductor device according to the second embodiment of the present disclosure.
Figure 15:
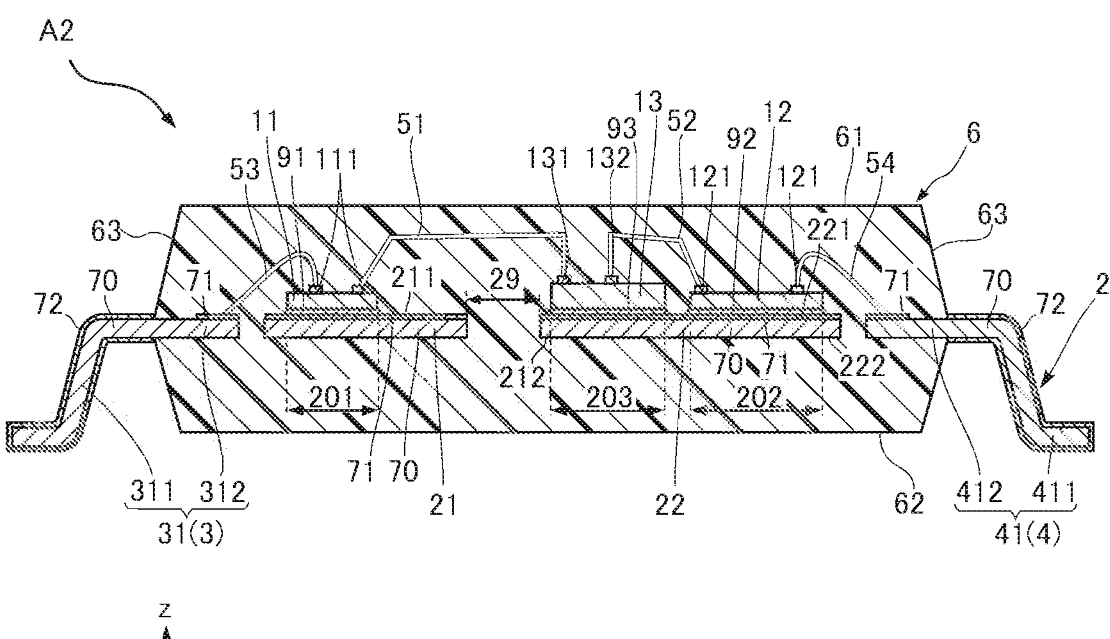
FIG. 15 is a sectional view taken along line XV-XV of FIG. 13.
Figure 15:
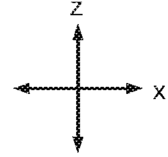

FIGS. 13 to 15 show a semiconductor device according to a second embodiment of the present disclosure. A semiconductor device A2 according to the present embodiment differs from the above embodiment in the location of the third semiconductor element 13 on the electroconductive support 2.

In the present embodiment, the third semiconductor element 13 is mounted on the second die pad 220 of the second lead 22. That is, the first semiconductor element 11 is mounted on the first die pad 210 of the first lead 21, whereas the second semiconductor element 12 and the third semiconductor element 13 are mounted on the second die pad 220 of the second lead 22. Hence, the first part 201 is included in the first lead 21, and the second part 202 and the third part 203 are included in the second lead 22. In this case, the receiving-side inductor is preferably located between the second die pad 220 and the transmitting-side inductor in the z direction. In the present embodiment, the third semiconductor element 13 is located between the first semiconductor element 11 and the second semiconductor element 12 in the x direction.

As shown in FIGS. 14 and 15, like the electroconductive support 2 of the semiconductor device A1, the electroconductive support 2 of the semiconductor device A2 is composed of the base 70 and the metal layers 71 and 72. The base 70 and the metal layers 71 and 72 are made of the same materials as those of the semiconductor device A1, and the metal layers 71 and 72 are provided at the same locations as those of the semiconductor device A1.

The present embodiment can improve the transmission efficiency. As can be understood from the present embodiment, the third semiconductor element 13 may be mounted on the second lead 22 instead of being limited to be on the first lead 21.

Figure 16:
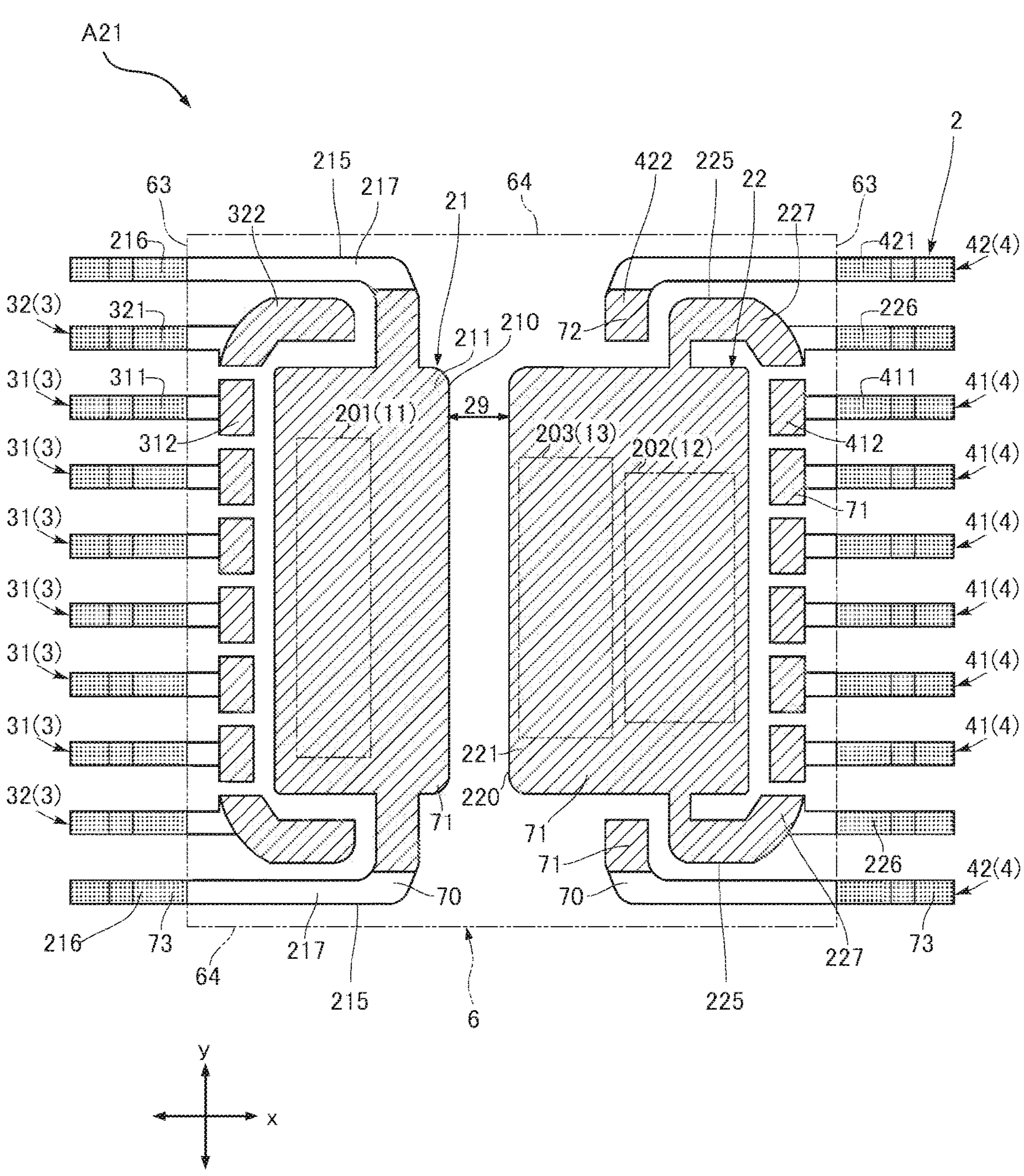
FIG. 16 is a fragmentary plan view of a semiconductor device according to a first variation of the second embodiment of the present disclosure.

FIG. 16 shows a first variation of the semiconductor device A2. A semiconductor device A21 of this variation differs from the semiconductor device A2 described above in the configuration of the electroconductive support 2.

In this variation, the metal layer 73 is used in place of the metal layer 72 disposed on the parts of the electroconductive support 2 in the semiconductor device A2. The metal layer 73 may be similar in configuration to the metal layer 73 of the semiconductor device A11 and contains a magnetic material. That is, the parts of the electroconductive support 2 provided with the metal layer 73 (the exposed parts 311, 321, 411, 421, 216 and 226) are not parts made of a non-magnetic material.

In this variation, the parts of the electroconductive support 2 covered with the sealing resin 6 are made of a non-magnetic material.

This variation can improve the transmission efficiency. The parts of the electroconductive support 2 covered with the sealing resin 6 are made of a non-magnetic material. These covered parts are closer within the electroconductive support 2 to the third semiconductor element 13 than the parts exposed from the sealing resin 6. Thus, improved transmission efficiency can be expected. In addition, permitting the use of a magnetic material, such as Ni, Pd or Au, on a part of the electroconductive support 2 exposed from the sealing resin 6 makes it possible to use the metal layer 73 without compromising the effect of preventing a disturbance of the magnetic field around the third semiconductor element. The metal layer 73 is compatible with a conductive bonding material, such as solder, and effective for protecting the electroconductive support 2 from deterioration.

Figure 17:
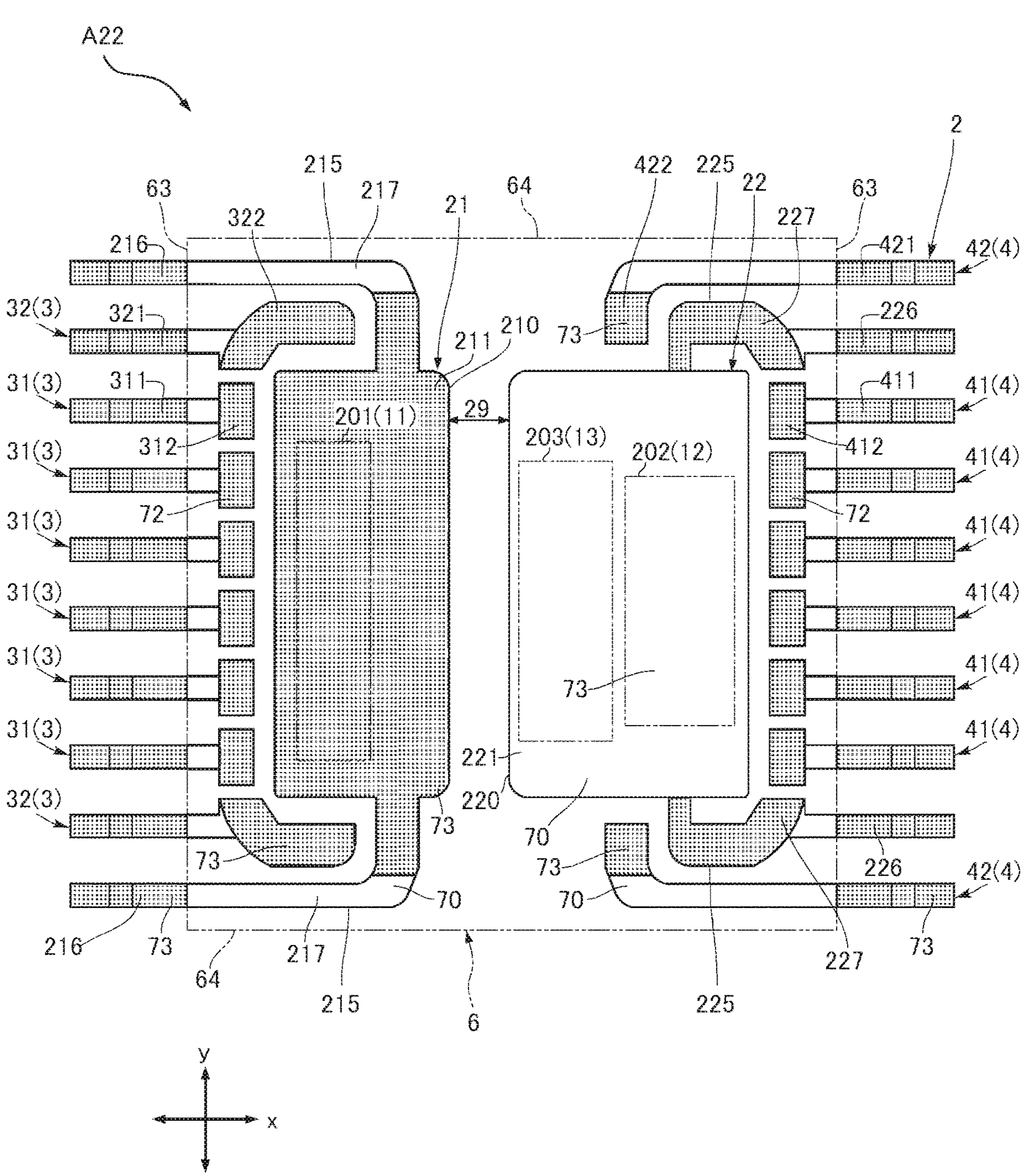
FIG. 17 is a fragmentary plan view of a semiconductor device according to a second variation of the second embodiment of the present disclosure.

FIG. 17 shows a second variation of the semiconductor device A2. A semiconductor device A22 of this variation differs from the semiconductor device A2 described above in the configuration of the electroconductive support 2.

The electroconductive support 2 of this variation is composed of the base 70 and the metal layer 73. In this variation, in addition to the metal layer 73 disposed in the semiconductor device A21, the metal layer 73 is also used in place of the metal layer 71 disposed on the parts of the first lead 21 and the terminal leads 3 and 4. In this variation, the second die pad 220 of the second lead 22 is composed of the base 70 but not provided with the metal layer 73. Each of the pair of terminal parts 225 is provided with the metal layer 73 covering a region of the covered part 227 connected to the second obverse surface 221.

In this variation, each of the second part 202 and the third part 203 is composed of the base 70 alone and thus is a part made of a non-magnetic material. In contrast, the first part 201 includes a magnetic material and thus is not a part made of a non-magnetic material.

This variation can improve the transmission efficiency. Notably, this variation can improve the transmission efficiency by configuring the third part 203 as a part made of a non-magnetic material, while permitting the use of the metal layer 73, which is made of a magnetic material, for improving the strength of bonding of the electroconductive support 2 with a conductive bonding material and protecting the electroconductive support 2 from deterioration.

Figure 18:
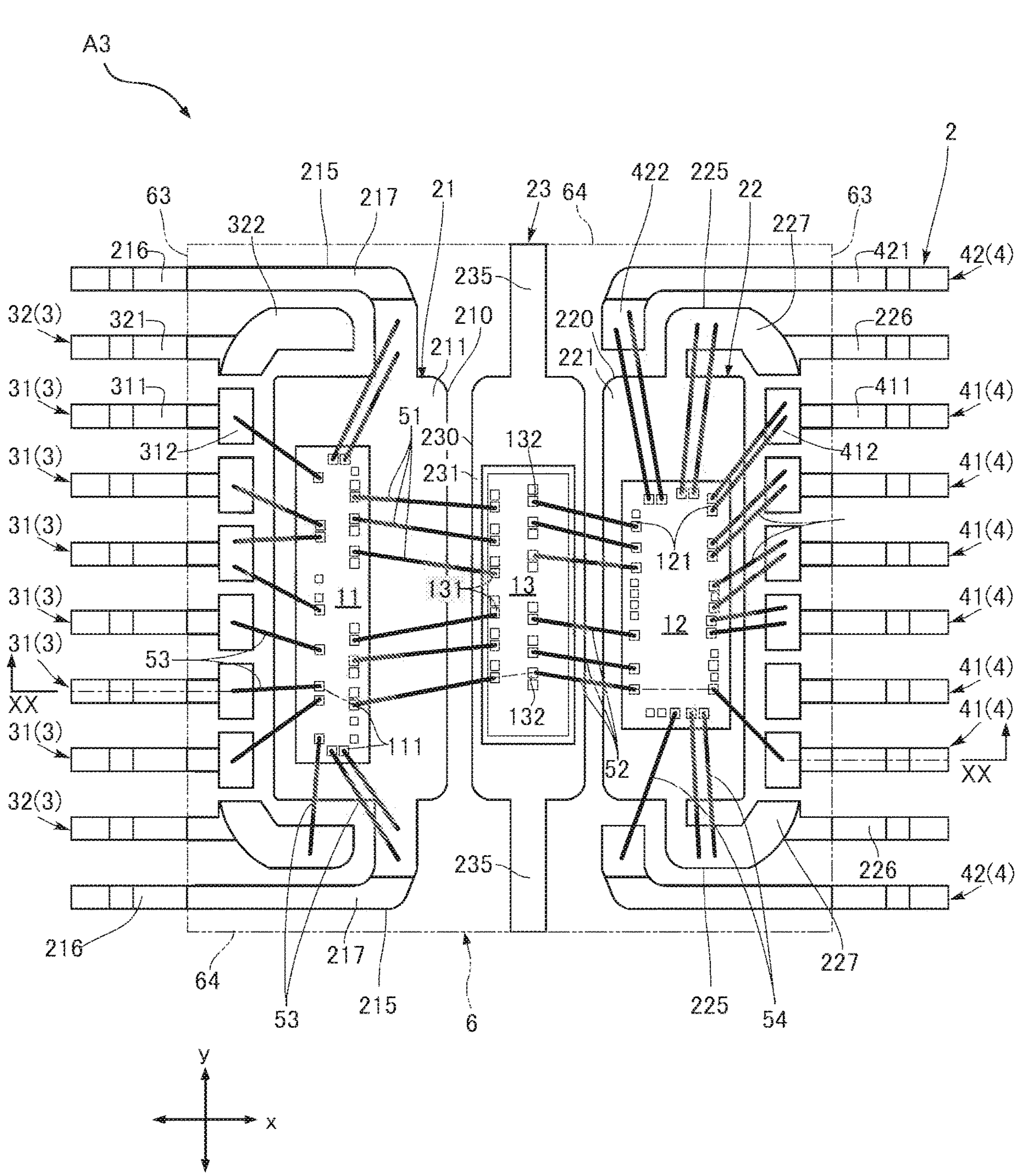
FIG. 18 is a plan view of a semiconductor device according to a third embodiment of the present disclosure.
Figure 19:
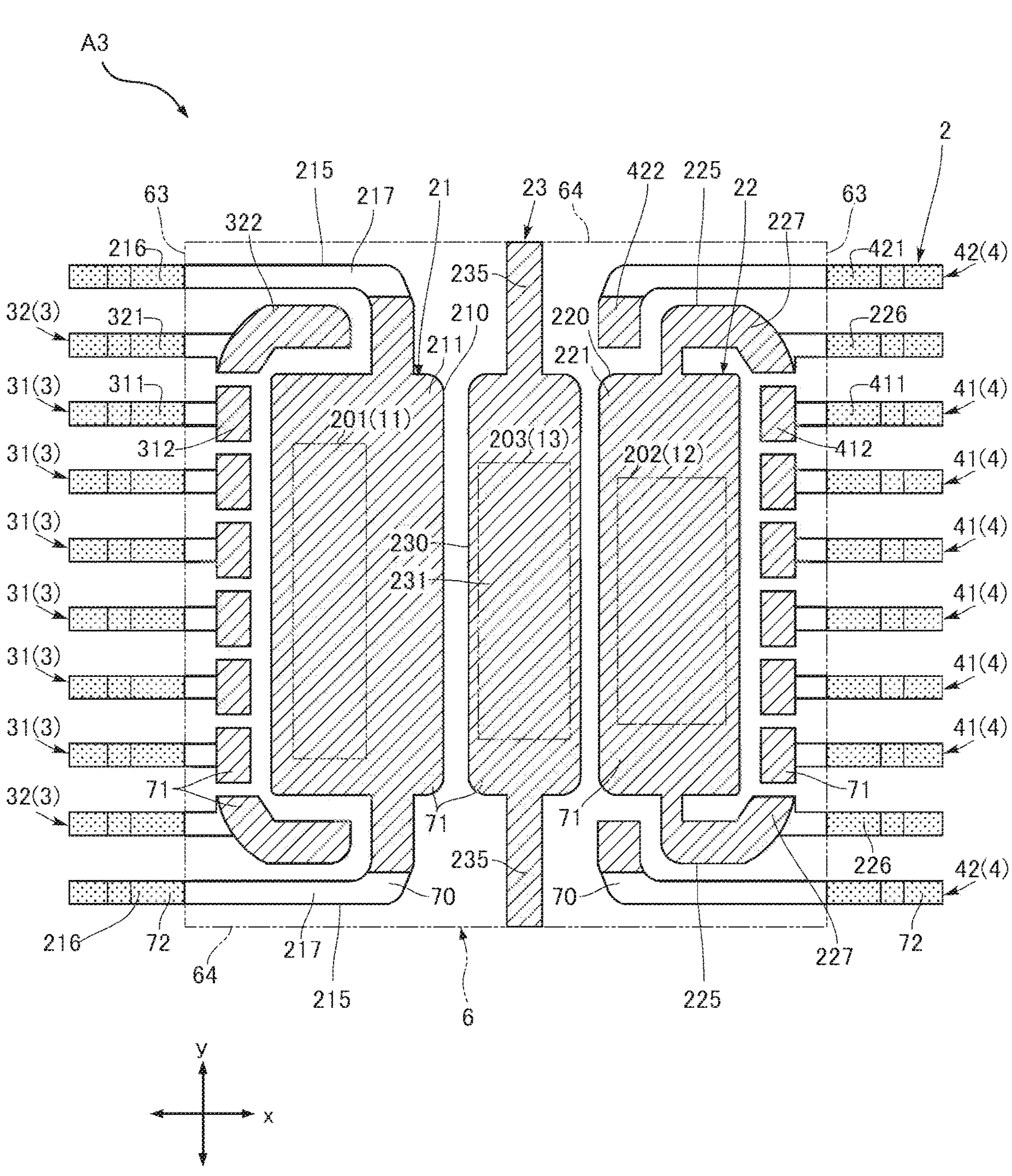
FIG. 19 is a fragmentary plan view of the semiconductor device according to the third embodiment of the present disclosure.
Figure 20:
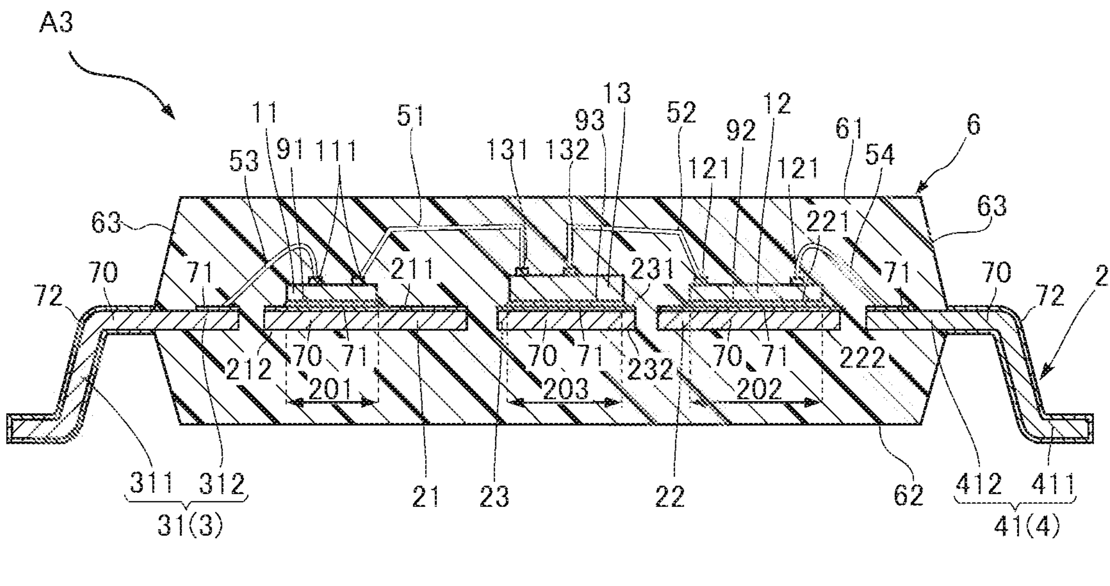
FIG. 20 is a sectional view taken along line XX-XX of FIG. 18.
Figure 20:
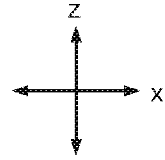

FIGS. 18 to 20 show a semiconductor device according to a third embodiment of the present disclosure. A semiconductor device A3 according to the present embodiment includes the electroconductive support 2 that includes the first lead 21, the second lead 22, a third lead 23, and the terminal leads 3 and 4.

The third lead 23 is located between the first lead 21 and the second lead 22 in the x direction and spaced apart from the first lead 21 and the second lead 22. The third lead 23 includes a third die pad 230 and a pair of extending parts 235.

The third die pad 230 is located between the first die pad 210 and the second die pad 220. The third die pad 230 is not limited to a specific shape. In the illustrated example, the third die pad 230 has a narrow rectangular shape extending in the y direction. The third die pad 230 includes a third obverse surface 231 and a third reverse surface 232. The third obverse surface 231 and the third reverse surface 232 face away from each other in the z direction.

The pair of extending parts 235 extend from the opposite ends of the third die pad 230 in the y direction. The extending parts 235 are shorter in length in the x direction than the length of the third die pad 230 in the x direction. The extending parts 235 are covered with the sealing resin 6, except on the end faces in the y direction.

In the present embodiment, the first semiconductor element 11 is mounted on the first die pad 210, the second semiconductor element 12 is mounted on the second die pad 220, and the third semiconductor element 13 is mounted on the third obverse surface 231 of the third die pad 230. That is, the first part 201 is included in the first lead 21, the second part 202 is included in the second lead 22, and the third part 203 is included in the third lead 23.

Like the electroconductive support 2 of the semiconductor device A1 and the semiconductor device A2, the electroconductive support 2 of the present embodiment is composed of the base 70 and the metal layers 71 and 72. The first lead 21, the second lead 22, and the terminal leads 3 and 4 are composed of the base 70 and the metal layers 71 and 72 that are similar in configuration to those of the semiconductor devices A1 and A2. The third lead 23 is composed of the base 70 and the metal layer 71. The third lead 23 is covered with the metal layer 71 except on the end faces of the pair of extending parts 235 facing in the y direction.

The present embodiment can improve the transmission efficiency. As can be understood from the present embodiment, the third semiconductor element 13 may be mounted on the third lead 23 that is separated from the first lead 21 and the second lead 22 instead of being limited to be on the first lead 21 or the second lead 22.

Figure 21:
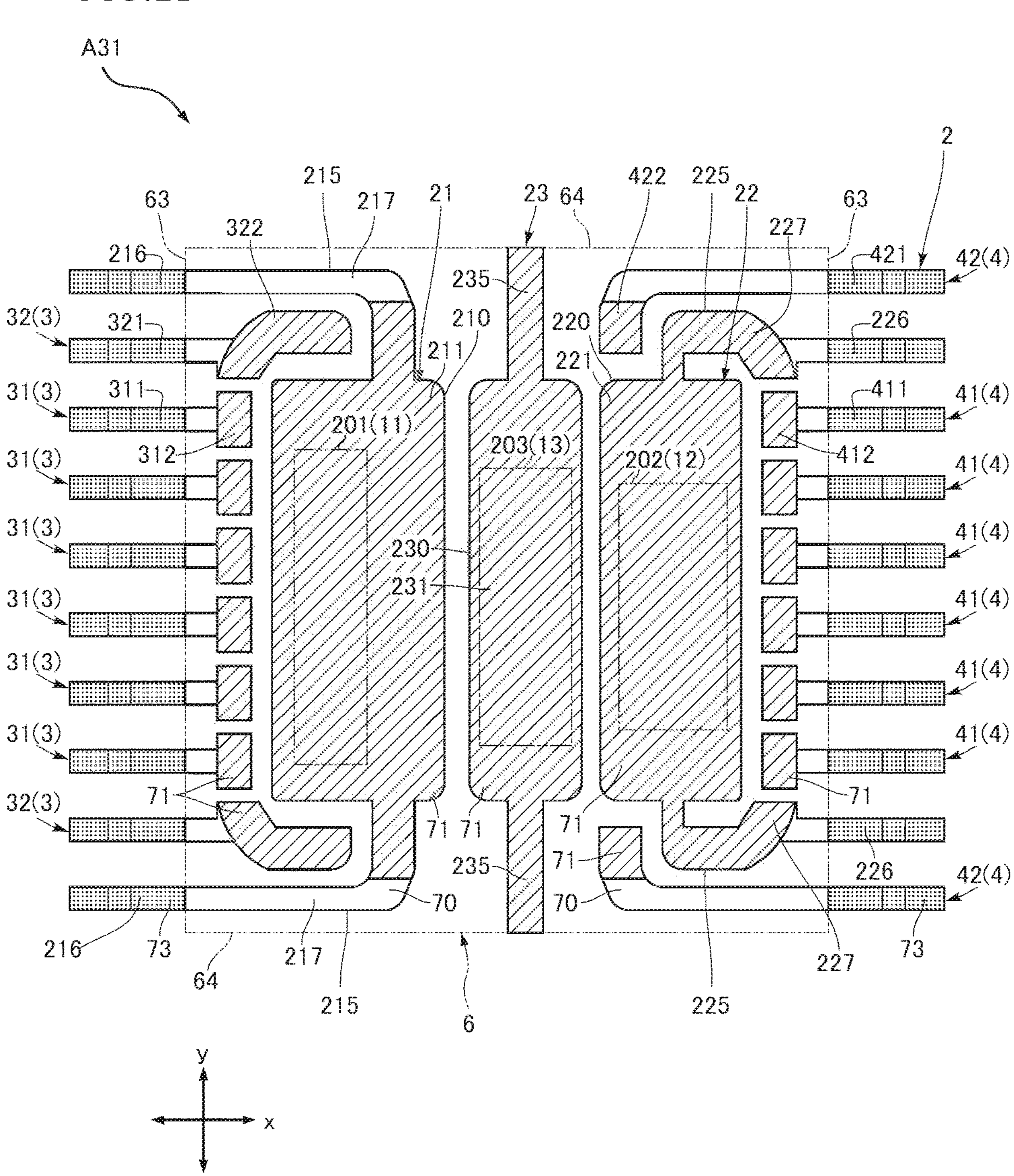
FIG. 21 is a fragmentary plan view of a semiconductor device according to a first variation of the third embodiment of the present disclosure.

FIG. 21 shows a first variation of the semiconductor device A3. A semiconductor device A31 of this variation differs from the semiconductor device A3 described above in the configuration of the electroconductive support 2.

In this variation, the metal layer 73 is used in place of the metal layer 72 disposed on the parts of the electroconductive support 2 in the semiconductor device A3. The metal layer 73 may be similar in configuration to the metal layer 73 of the semiconductor device A11 and contains a magnetic material. That is, the parts of the electroconductive support 2 provided with the metal layer 73 (the exposed parts 311, 321, 411, 421, 216 and 226) are not parts made of a non-magnetic material.

In this variation, the parts of the electroconductive support 2 covered with the sealing resin 6 are made of a non-magnetic material.

This variation can improve the transmission efficiency. The parts of the electroconductive support 2 covered with the sealing resin 6 are made of a non-magnetic material. These covered parts are closer within the electroconductive support 2 to the third semiconductor element 13 than the parts exposed from the sealing resin 6. Thus, improved transmission efficiency can be expected. In addition, permitting the use of a magnetic material, such as Ni, Pd or Au, on a part of the electroconductive support 2 exposed from the sealing resin 6 makes it possible to use the metal layer 73 without compromising the effect of preventing a disturbance of the magnetic field around the third semiconductor element. The metal layer 73 is compatible with a conductive bonding material, such as solder, and effective for protecting the electroconductive support 2 from deterioration.

Figure 22:
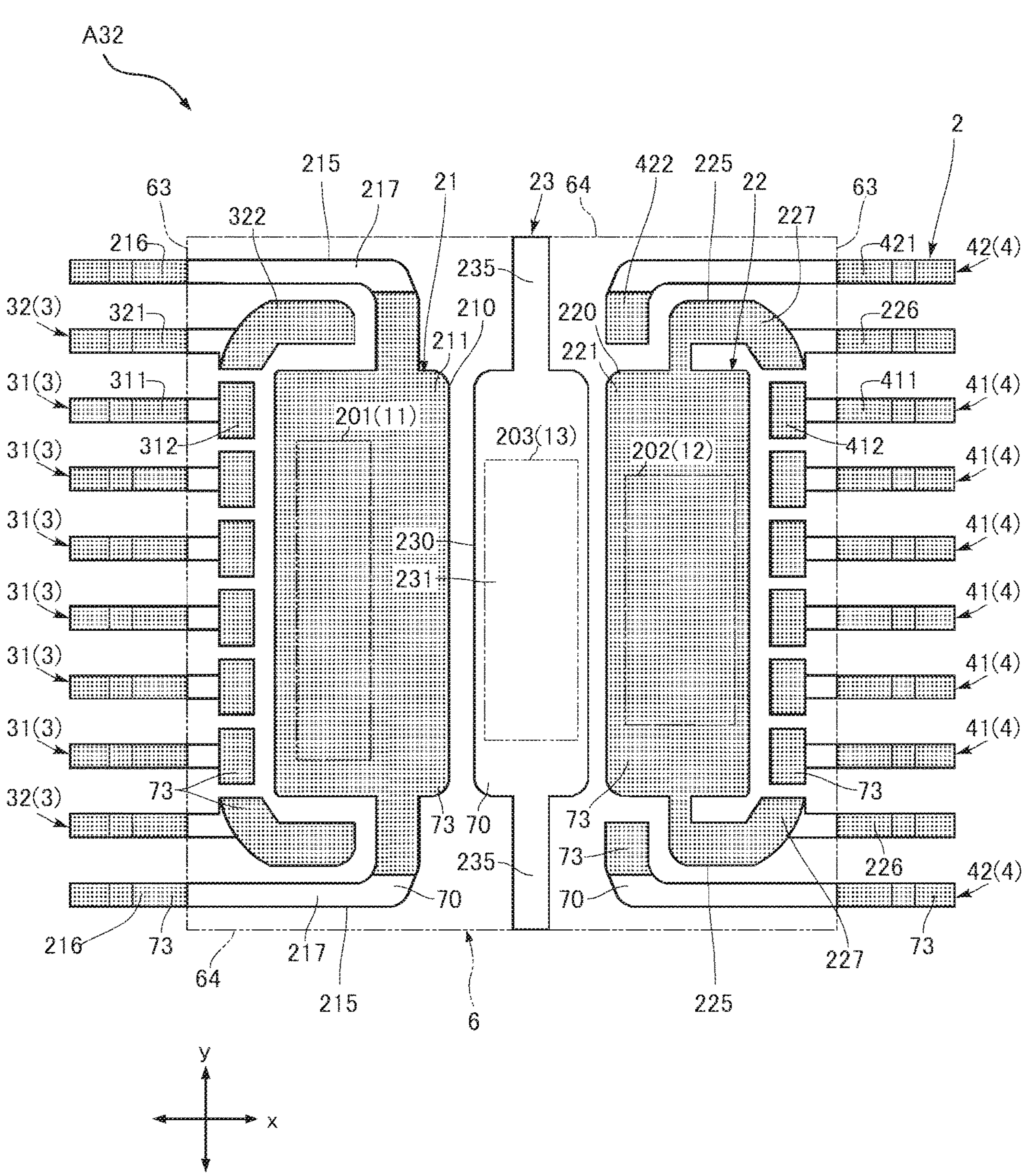
FIG. 22 is a fragmentary plan view of a semiconductor device according to a second variation of the third embodiment of the present disclosure.

FIG. 22 shows a second variation of the semiconductor device A3. A semiconductor device A32 of this variation differs from the semiconductor device A3 described above in the configuration of the electroconductive support 2.

The electroconductive support 2 of this variation is composed of the base 70 and the metal layer 73. In this variation, in addition to the metal layer 73 disposed in the semiconductor device A31, the metal layer 73 is also used in place of the metal layer 71 disposed on the parts of the first lead 21, the second lead 22 and the terminal leads 3 and 4. Note that the third lead 23 is composed of the base 70 alone.

In this variation, the third part 203 is composed of the base 70 alone and thus is a part made of a non-magnetic material. In contrast, the first part 201 and the second part 202 are not parts made of a non-magnetic material as the first die pad 210 and the second die pad 220 contain a magnetic material.

This variation can improve the transmission efficiency. Notably, this variation can improve the transmission efficiency by configuring the third part 203 as a part made of a non-magnetic material, while permitting the use of the metal layer 73, which is made of a magnetic material, for improving the strength of bonding of the electroconductive support 2 with a conductive bonding material and protecting the electroconductive support 2 from deterioration.

The semiconductor devices according to the present disclosure are not limited to the embodiments described above. The specific configuration of each part of a semiconductor device according to the present disclosure may suitably be designed and changed in various manners. The present disclosure includes the embodiments described in the following clauses.

Clause 1.

A semiconductor device comprising:

an electroconductive support including a plurality of leads;

a first semiconductor element supported by the electroconductive support;

a second semiconductor element supported by the electroconductive support;

a third semiconductor element supported by the electroconductive support, electrically connected to the first semiconductor element and the second semiconductor element, and insulating the first semiconductor element and the second semiconductor element from each other; and a sealing resin covering the first semiconductor element, the second semiconductor element, the third semiconductor element and a part of the electroconductive support, wherein the electroconductive support includes:

a first part that overlaps with the first semiconductor element as viewed in a thickness direction of the plurality of leads;

a second part that overlaps with the second semiconductor element as viewed in the thickness direction; and a third part that overlaps with the third semiconductor element as viewed in the thickness direction, and the third part is made of a non-magnetic material having a relative permeability of less than 100.

Clause 2.

The semiconductor device according to Clause 1, wherein the first part is made of the non-magnetic material.

Clause 3.

The semiconductor device according to Clause 1 or 2, wherein the second part is made of the non-magnetic material.

Clause 4.

The semiconductor device according to any one of Clauses 1 to 3, wherein the electroconductive support includes a first lead that includes the first part, and the first lead is made of the non-magnetic material.

Clause 5.

The semiconductor device according to Clause 4, wherein the electroconductive support includes a second lead including the second part and spaced apart from the first lead, and the second lead is made of the non-magnetic material.

Clause 6.

The semiconductor device according to Clause 5, wherein the first lead includes the third part.

Clause 7.

The semiconductor device according to Clause 5, wherein the second lead includes the third part.

Clause 8.

The semiconductor device according to any one of Clauses 5 to 7, wherein the electroconductive support includes a first terminal lead electrically connected to the first semiconductor element and spaced apart from the first lead and the second lead, the first terminal lead includes a first covered part that is covered with the sealing resin and a first exposed part that is exposed from the sealing resin, and the first covered part is made of the non-magnetic material.

Clause 9.

The semiconductor device according to Clause 8, wherein the first terminal lead is made of the non-magnetic material.

Clause 10.

The semiconductor device according to any one of Clauses 5 to 9, wherein the electroconductive support includes a second terminal lead electrically connected to the second semiconductor element and spaced apart from the first lead and the second lead, the second terminal lead includes a second covered part that is covered with the sealing resin and a second exposed part that is exposed from the sealing resin, and the second covered part is made of the non-magnetic material.

Clause 11.

The semiconductor device according to Clause 10, wherein the second terminal lead is made of the non-magnetic material.

Clause 12.

The semiconductor device according to any one of Clauses 1 to 11, further comprising:

a first bonding layer bonding the first semiconductor element and the first part;

a second bonding layer bonding the second semiconductor element and the second part; and a third bonding layer bonding the third semiconductor element and the third part, wherein the third bonding layer is made of the non-magnetic material.

Clause 13.

The semiconductor device according to Clause 12, wherein the first bonding layer and the second bonding layer are made of the non-magnetic material.

Clause 14.

The semiconductor device according to any one of Clauses 1 to 13, wherein the third part includes a base made of Cu or a Cu alloy having a relative permeability of less than 100.

Clause 15.

The semiconductor device according to Clause 14, wherein the third part includes a Ag plated layer on the base.

Clause 16.

The semiconductor device according to Clause 8, wherein the first terminal lead includes a base made of Cu or a Cu alloy having a relative permeability of less than 100, the first covered part includes a Ag plated layer on the base, and the first exposed part includes a Sn plated layer on the base.

Clause 17.

The semiconductor device according to Clause 10, wherein the second terminal lead includes a base made of Cu or a Cu alloy having a relative permeability of less than 100, the second covered part includes a Ag plated layer on the base, and the second exposed part includes a Sn plated layer on the base.

REFERENCE NUMERALS

A1, A11, A12, A2, A21, A22, A3, A31, A32: Semiconductor device

| | |
|---|---|
| 2: Electroconductive support | 3: Terminal lead |
| 4: Terminal lead | 6: Sealing resin |
| 11: First semiconductor element | 12: Second semiconductor element |
| 13: Third semiconductor element | 21: First lead |
| 22: Second lead | 23: Third lead |
| 29: Pad gap | 31: Terminal lead (First terminal lead) |
| 32: Terminal lead | 41: Terminal lead (Second terminal lead) |
| 42: Terminal lead | 51: First wire |
| 52: Second wire | 53: Third wire |
| 54: Fourth wire | 61: Top surface |
| 62: Bottom surface | 63: First side surface |
| 64: Second side surface | 70: Base |
| 71, 72, 73: Metal layer | 91: First bonding layer |
| 92: Second bonding layer | 93: Third bonding layer |
| 111, 121: Electrode | 131: First electrode |
| 132: Second electrode | 201: First part |
| 202: Second part | 203: Third part |
| 210: First die pad | 211: First obverse surface |
| 212: First reverse surface | 215: Terminal part |
| 216, 226, 321, 411, 421: exposed part | 217, 227, 312, 322, 412, 422: covered part |
| 220: Second die pad | 221: Second obverse surface |
| 222: Second reverse surface | 225: terminal part |
| 230: Third die pad | 231: Third obverse surface |
| 232: Third reverse surface | 235: extending part |
| 631: First upper part | 632: First lower part |
| 633: First middle part | 641: Second upper part |
| 642: Second lower part | 643: Second middle part |

The invention claimed is:

1. A semiconductor device comprising:

an electroconductive support including a plurality of leads;

a first semiconductor element supported by the electroconductive support;

a second semiconductor element supported by the electroconductive support;

a third semiconductor element supported by the electroconductive support, electrically connected to the first semiconductor element and the second semiconductor element, and insulating the first semiconductor element and the second semiconductor element from each other; and a sealing resin covering the first semiconductor element, the second semiconductor element, the third semiconductor element and a part of the electroconductive support, wherein the electroconductive support includes:

a first part that overlaps with the first semiconductor element as viewed in a thickness direction of the plurality of leads;

a second part that overlaps with the second semiconductor element as viewed in the thickness direction; and a third part that overlaps with the third semiconductor element as viewed in the thickness direction, the third part is made of a non-magnetic material having a relative permeability of less than 100, and the third semiconductor element is an insulating element configured to relay a signal from the first semiconductor element to the second semiconductor element, while also electrically insulating the first semiconductor element and the second semiconductor element from each other.

2. The semiconductor device according to claim 1, wherein the first part is made of the non-magnetic material.

3. The semiconductor device according to claim 1, wherein the second part is made of the non-magnetic material.

4. The semiconductor device according to claim 1, wherein the electroconductive support includes a first lead that includes the first part, and the first lead is made of the non-magnetic material.

5. The semiconductor device according to claim 4, wherein the electroconductive support includes a second lead including the second part and spaced apart from the first lead, and the second lead is made of the non-magnetic material.

6. The semiconductor device according to claim 5, wherein the first lead includes the third part.

7. The semiconductor device according to claim 5, wherein the second lead includes the third part.

8. The semiconductor device according to claim 5, wherein the electroconductive support includes a first terminal lead electrically connected to the first semiconductor element and spaced apart from the first lead and the second lead, the first terminal lead includes a first covered part that is covered with the sealing resin and a first exposed part that is exposed from the sealing resin, and the first covered part is made of the non-magnetic material.

9. The semiconductor device according to claim 8, wherein the first terminal lead is made of the non-magnetic material.

10. The semiconductor device according to claim 8, wherein the first terminal lead includes a base made of Cu or a Cu alloy having a relative permeability of less than 100, the first covered part includes a Ag plated layer on the base, and the first exposed part includes a Sn plated layer on the base.

11. The semiconductor device according to claim 5, wherein the electroconductive support includes a second terminal lead electrically connected to the second semiconductor element and spaced apart from the first lead and the second lead, the second terminal lead includes a second covered part that is covered with the sealing resin and a second exposed part that is exposed from the sealing resin, and the second covered part is made of the non-magnetic material.

12. The semiconductor device according to claim 11, wherein the second terminal lead is made of the non-magnetic material.

13. The semiconductor device according to claim 11, wherein the second terminal lead includes a base made of Cu or a Cu alloy having a relative permeability of less than 100, the second covered part includes a Ag plated layer on the base, and the second exposed part includes a Sn plated layer on the base.

14. The semiconductor device according to claim 1, further comprising:

a first bonding layer bonding the first semiconductor element and the first part;

a second bonding layer bonding the second semiconductor element and the second part; and a third bonding layer bonding the third semiconductor element and the third part, wherein the third bonding layer is made of the non-magnetic material.

15. The semiconductor device according to claim 14, wherein the first bonding layer and the second bonding layer are made of the non-magnetic material.

16. The semiconductor device according to claim 1, wherein the third part includes a base made of Cu or a Cu alloy having a relative permeability of less than 100.

17. The semiconductor device according to claim 16, wherein the third part includes a Ag plated layer on the base.

18. The semiconductor device according to claim 1, wherein the first semiconductor element is provided with a control circuit configured to convert a signal inputted to the first semiconductor element to a control signal, the second semiconductor element is provided with a drive circuit configured to conduct a switching operation based on the control signal from the first semiconductor element, and the third semiconductor element is an insulating element of an inductive type including a plurality of coils.

* * * * *